(12) United States Patent
Gorokhovsky et al.

(10) Patent No.: US 9,412,569 B2
(45) Date of Patent: *Aug. 9, 2016

(54) REMOTE ARC DISCHARGE PLASMA ASSISTED PROCESSES

(75) Inventors: Vladimir Gorokhovsky, San Antonio, TX (US); William Grant, Lafayette, CO (US); Edward W. Taylor, Erie, CO (US); David Humenik, Longmont, CO (US); Klaus Brondum, Ann Arbor, MI (US)

(73) Assignee: VAPOR TECHNOLOGIES, INC., Longmont, CO (US)

( * ) Notice: Subject to any disclaimer, the term of this patent is extended or adjusted under 35 U.S.C. 154(b) by 654 days.

This patent is subject to a terminal disclaimer.

(21) Appl. No.: 13/617,005

(22) Filed: Sep. 14, 2012

(65) Prior Publication Data

US 2014/0076718 A1    Mar. 20, 2014

(51) Int. Cl.
*H01J 37/34* (2006.01)
*C23C 14/32* (2006.01)
(Continued)

(52) U.S. Cl.
CPC ......... *H01J 37/3438* (2013.01); *C23C 14/0641* (2013.01); *C23C 14/22* (2013.01); *C23C 14/32* (2013.01); *C23C 14/325* (2013.01); *C23C 14/3471* (2013.01); *C23C 14/3478* (2013.01); *C23C 14/35* (2013.01); *C23C 14/354* (2013.01);
(Continued)

(58) Field of Classification Search
CPC ............. H01J 37/32917; H01J 37/32935; H01J 37/3405; H01J 37/3417; H01J 37/32055; H01J 37/3438; H01J 37/3408; H01J 37/32614; H01J 49/12; C23C 14/32; C23C 14/355; C23C 14/0641; C23C 14/22; C23C 14/354; C23C 14/3471; C23C 14/3478; C23C 14/325; C23C 14/35
See application file for complete search history.

(56) References Cited

U.S. PATENT DOCUMENTS 3,436,332 A  4/1969  Oda et al.
3,583,899 A  6/1971  Aronson
(Continued)

FOREIGN PATENT DOCUMENTS

DE   23 21 665 A1   11/1973
DE   3413728 A1     10/1984
(Continued)

OTHER PUBLICATIONS

EP Communication mailed Jun. 26, 2014 forwarding EP Search Report completed Jun. 3, 2014 in EP Appn. No. 14160153, 6 pgs).
(Continued)

Primary Examiner — Michael Band
(74) Attorney, Agent, or Firm — Brooks Kushman P.C.

(57) ABSTRACT

A coating system includes a vacuum chamber and a coating assembly positioned within the vacuum chamber. The coating assembly includes a vapor source that provides material to be coated onto a substrate, a substrate holder to hold substrates to be coated such that the substrates are positioned in front of the vapor source, a cathode chamber assembly, and a remote anode. The cathode chamber assembly includes a cathode, an optional primary anode and a shield which isolates the cathode from the vacuum chamber. The shield defines openings for transmitting an electron emission current from the cathode into the vacuum chamber. The vapor source is positioned between the cathode and the remote anode while the remote anode is coupled to the cathode.

15 Claims, 21 Drawing Sheets

(51) Int. Cl.

| | |
|---|---|
| C23C 14/35 | (2006.01) |
| H01J 37/32 | (2006.01) |
| H01J 49/12 | (2006.01) |
| C23C 14/34 | (2006.01) |
| C23C 14/06 | (2006.01) |
| C23C 14/22 | (2006.01) |

(52) U.S. Cl.
CPC ......... *C23C 14/355* (2013.01); *H01J 37/32055* (2013.01); *H01J 37/32614* (2013.01); *H01J 37/32917* (2013.01); *H01J 37/32935* (2013.01); *H01J 37/3405* (2013.01); *H01J 37/3408* (2013.01); *H01J 37/3417* (2013.01); *H01J 49/12* (2013.01)

(56) References Cited

U.S. PATENT DOCUMENTS

| | | | |
|---|---|---|---|
| 4,111,783 | A | 9/1978 | Bindell et al. |
| 4,155,825 | A | 5/1979 | Fournier |
| 4,254,159 | A | 3/1981 | Pulker et al. |
| 4,434,038 | A | 2/1984 | Morrison, Jr. |
| 4,448,799 | A | 5/1984 | Bergman et al. |
| 4,588,490 | A | 5/1986 | Cuomo et al. |
| 4,730,334 | A | 3/1988 | Collins et al. |
| 636,270 | A | 11/1988 | Loos |
| 4,877,505 | A | 10/1989 | Bergmann |
| 5,250,779 | A | 10/1993 | Kaufmann et al. |
| 5,262,032 | A | 11/1993 | Hartig et al. |
| 5,294,322 | A | 3/1994 | Vetter et al. |
| 5,346,600 | A | 9/1994 | Nieh et al. |
| 5,503,725 | A | 4/1996 | Sablev et al. |
| 5,635,087 | A | 6/1997 | Schiller |
| 6,153,067 | A | 11/2000 | Maishev et al. |
| 6,238,537 | B1 | 5/2001 | Kahn |
| 6,296,742 | B1 | 10/2001 | Kouznetsov |
| 6,300,720 | B1 | 10/2001 | Birx |
| 6,365,009 | B1 | 4/2002 | Ishibashi |
| 6,579,421 | B1 | 6/2003 | Fu |
| 6,663,755 | B2 * | 12/2003 | Gorokhovsky .......... 204/298.41 |
| 6,692,617 | B1 | 2/2004 | Fu et al. |
| 7,147,759 | B2 | 12/2006 | Chistyakov |
| 7,160,616 | B2 | 1/2007 | Massler et al. |
| 7,300,559 | B2 * | 11/2007 | Gorokhovsky .......... 204/192.38 |
| 7,327,089 | B2 | 2/2008 | Madocks |
| 7,498,587 | B2 | 3/2009 | Welty |
| 8,500,975 | B2 | 8/2013 | Le et al. |
| 2002/0007796 | A1 | 1/2002 | Gorokhovsky |
| 2003/0089601 | A1 | 5/2003 | Ding et al. |
| 2007/0087185 | A1 | 4/2007 | Wei et al. |
| 2008/0035470 | A1 | 2/2008 | Tietema et al. |
| 2008/0110749 | A1 | 5/2008 | Krassnitzer et al. |
| 2008/0292812 | A1 | 11/2008 | Ramm et al. |
| 2009/0214787 | A1 | 8/2009 | Wei et al. |
| 2010/0264016 | A1 | 10/2010 | Anders et al. |
| 2011/0100800 | A1 | 5/2011 | Gorokhovsky |
| 2011/0111190 | A1 | 5/2011 | Wei et al. |
| 2011/0226617 | A1 | 9/2011 | Hofmann et al. |
| 2012/0114871 | A1 | 5/2012 | Gorokhovsky |
| 2014/0076715 | A1 * | 3/2014 | Gorokhovsky et al. .. 204/192.12 |
| 2014/0076716 | A1 * | 3/2014 | Gorokhovsky et al. .. 204/192.12 |

FOREIGN PATENT DOCUMENTS

| | | |
|---|---|---|
| DE | 34 26 145 A1 | 3/1985 |
| EP | 0 306 612 A1 | 3/1989 |
| EP | 1852891 | 11/2007 |
| EP | 2 431 995 A1 | 3/2012 |
| EP | 2 778 254 A1 | 9/2014 |
| WO | 2005/005684 A1 | 1/2005 |
| WO | 2007/124879 A2 | 11/2007 |

OTHER PUBLICATIONS

Novikov et al. Surface and Coating Technology Journal, Aug. 1991, vol. 47, Issues 1-3, p. 770-791, "Superhard i-C coatings used in complex processes of surface strengthening of tools and machine parts."

Posadowski., Multicomponent and Multilayered Thin Films for Advanced Microtechnologies: Techniques, Fundamentals and Devices, NATO ASI Series, Ed. by Orlando Auciello, Jurgen Engemann, vol. 234, 1993, p. 109-113, "Discharge Density Increase for High Rate Magnetron Sputtering".

Gorokhovsky et al. Surface and Coating Technology 2013, vol. 215, p. 431-439, "Ion Treatment by low pressure arc plasma immersion surface engineering processes."

Spatenka et al. Plasma Sources Sci. Technol. 1997, vol. 6, p. 46-52, "A comparison of internal plasma parameters in a conventional planar magnetron and a magnetron with additional plasma confinement."

Wakeham et al. Thin Solid Films 2009, 4 Pages, "Low temperature remote plasma sputtering of indium tin oxide for flexible display applications."

Tisone et al. J. Vac. Sci. Technol. Mar./Apr. 1974, vol. 11, No. 2, p. 519-527, "Low-voltage triode sputtering with a confined plasma: Part I—geometric aspects of deposition."

Sagas et al. Vacuum 2011, vol. 85, p. 705-710, "Influence of electromagnetic confinement on the characteristics of a triode magnetron sputtering system."

Li et al. J. Phys. D Appl. Phys. 1999, vol. 32, p. 1039-1043, "A description of metal-vapour production in a hallow-cylindrical magnetron sputtering discharge."

Degout et al. Surface and Coatings Technology 1993, vol. 57, p. 105-110, "High current density triode magnetron sputtering."

Andersson et al. Applied Physics Letters 2008, vol. 92, p. 221503-1-221503-3, "Gasless sputtering Opportunities for ultraclean metallization, coatings in space, and propulsion."

European Search Report dated May 21, 2014 in EP Appn. No. 13183572.0, 10 pgs.

Schneider, J.M., "Recent developments in plasma assisted physical vapour deposition," J. Phys. D: Appl. Phys., v. 33, Sep. 21, 2000, pp. R173-R186.

Cuomo, J.J., "Hollow-cathode-enhanced magnetron sputtering," J. of Vac. Sci. Technol. A: Vacuum Surfaces and Films, v. 4, No. 3, May 1, 1986, pp. 393-396.

European Extended Search Report dated Mar. 13, 2015 in EP Appn. No. 14190737.8, 13 pgs.

Espe, W. et al., "Getter Materials," Electronics Magazine, Oct. 1950, pp. 1-10.

Phywe Systeme GmbH & Co. KG, "Plasma physics: paschen curve", Mar. 5, 2011, pp. 1-4.

Non-final Office Action of Nov. 17, 2015 in U.S. Appl. No. 13/840,305, filed Mar. 15, 2013, 16 pgs.

Non-final Office Action of May 2, 2016 in U.S. Appl. No. 13/617,005, filed Oct. 28, 2013, 17 pgs.

* cited by examiner

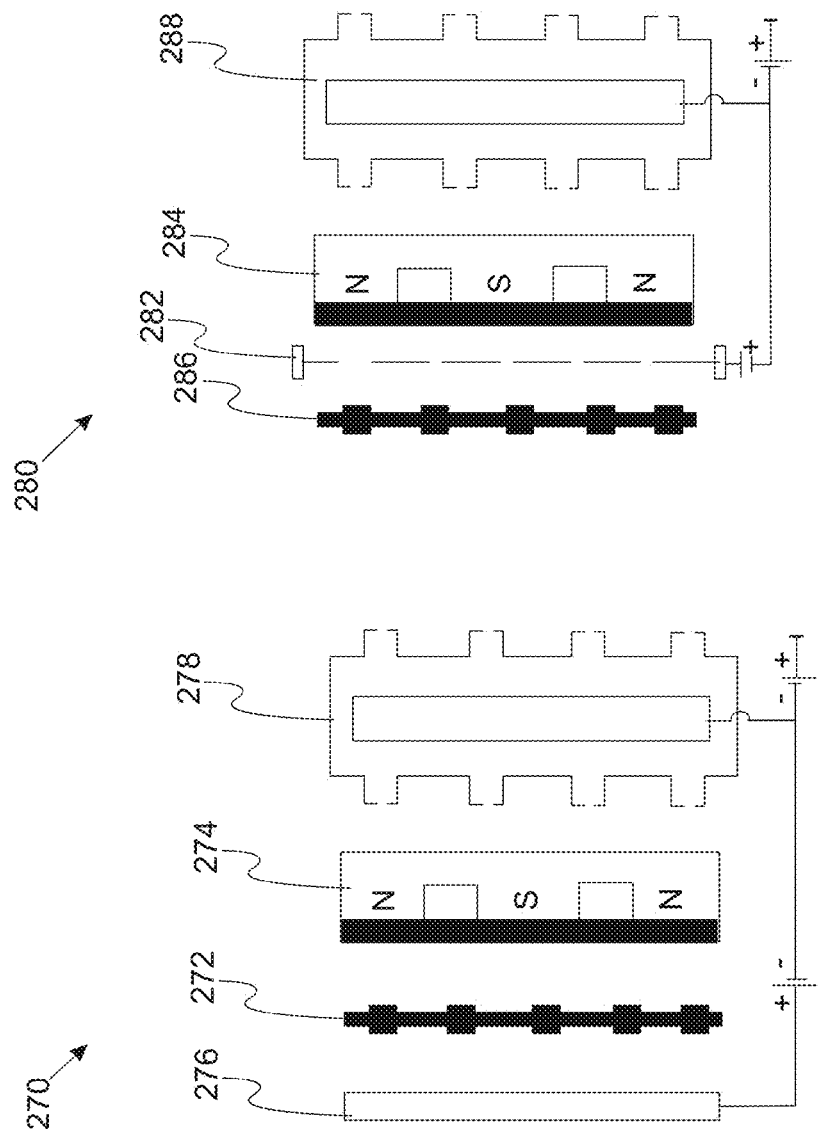

REMOTE ARC DISCHARGE PLASMA ASSISTED PROCESSES

FIELD OF THE INVENTION

The present invention relates to plasma assisted deposition systems and related methods.

BACKGROUND OF THE INVENTION

Physical vapor deposition (PVD) and low pressure Chemical vapor deposition (CVD) sources are used for deposition of coatings and surface treatment. Conventional metal vapor sources such as electron beam physical vapor deposition (EB-PVD) and magnetron sputtering (MS) metal vapor sources can provide high deposition rates. However, the low energy of the metal vapor atoms and the low ionization rate of these processes result in coatings with low density, poor adhesion, poor structure and morphology. It is well established that assistance of the coating deposition process with bombardment by energetic particles dramatically improves coatings by densifying the depositing materials, reducing the grain size and improving coating adhesion. In these processes, the surface layer is affected by a high rate of bombardment by energetic ions which modifies the mobility of depositing metal vapor atoms and, in many cases, creates metastable structures with unique functional properties. Moreover, ion bombardment of the coating surface influences gas adsorption behavior by increasing the sticking coefficient of gases such as nitrogen and changing the nature of adsorption sites from lower energy physic-sorption sites to higher energy chemi-sorption sites. This approach is especially productive in the deposition of nanostructured composite coatings with ultra-fine or glass-like amorphous structures.

There are two different approaches to provide ion bombardment assistance during PVD or CVD processes. Ion beam assisted deposition (IBAD) is a method which holds great promise for forming dense ceramic coatings on polymers and other temperature sensitive materials. The IBAD process is typically carried out under vacuum (~$1 \times 10^{-5}$ Torr) in which a ceramic is thermally evaporated onto a substrate and simultaneously bombarded with energetic ions. The ion beam causes the deposited atoms to mix with the substrate, creating a graded layer, which can improve coating adhesion and reduce film stress. The impinging ions also produce a "shot-peening effect" which compacts and densifies the layer thereby reducing or eliminating columnar growth.

For example, during the IBAD processing of diamond-like carbon (DLC) films, carbon is evaporated by an electron beam source or sputtered by a magnetron source. Ion bombardment is provided by an independent broad-aperture ion beam source such as an argon ion beam. Such argon ion beams do not change the chemistry of the growing films and only influences its structure, morphology, binding energy and atom-to-atom bonding by lattice network modification. Addition of an appropriate gaseous precursor to the ion beam results in doping of the growing DLC films thereby providing a chemical vapor assistance during the IBAD process. An example of such silicon doping of DLC films are deposited from an $Ar+SiH_4$ ion beam. Fluoride can be added to the films via an Ar and fluorohydrocarbon ion beam, nitrogen can be added by using an Ar and $N_2$ ion beam, and boron can be added by using $Ar+BH_4$ ion beam. IBAD is a flexible technological process which allows control of coating properties in a broadened area by variation of the processing parameters: the ion beam composition, ion energy, ion current and the ion-to-atom arrival ratio.

Although the IBAD process works reasonably well, it has limitations due to its line-in-sight nature which is detrimental to achieving uniform coating distribution over complex shape components when the conformity of the coating deposition process is important. In addition, the IBAD process has limited scale up capability. The plasma immersion ion deposition (PIID) process overcomes some of these limitations by providing a low pressure plasma environment which effectively envelops the substrates to be coated within the uniform plasma cloud. This results in a highly uniform rate of ion bombardment over both 3-D complex shape substrates and large loads. The PVD or CVD process is used to generate vapor species for treatment of the substrate surface. In contrast to IBAD, the PIID is a non-line-of-sight process capable of treating complex surfaces without manipulation. PIID utilizes plasma generated from a gas discharge that fills in the entire processing chamber thereby allowing complex compositions and architectures to be coated. Examples of plasma immersion ion treatment include ionitriding, carbonitriding, ion implantation and other gaseous ion treatment processes that may be performed by immersing a substrate to be coated in a nitrogen containing plasma under negative bias. In addition, the electron current extracted from the plasma when substrates are positively biased can be used for pre-heating and heat treatment processes. Clearly, the non-line-of-sight processing feature presents numerous advantages over the line-of-sight processing, particularly for the efficient processing of a large quantity of object and 3-D objects. The ionized gaseous environment used during the PIID processes can be generated by applying different types of plasma discharges, such as glow discharge, RF discharge, micro-wave (MW) discharge and low pressure arc discharge. Low pressure arc discharge is particularly advantageous in that it provides a dense, uniform highly ionized plasma over large processing volumes at low cost. In the arc discharge plasma assisted coating deposition or ion treatment processes, substrates are positioned between the arc cathode and the distant arc anode within the arc discharge plasma area. Thermionic filament cathodes, hollow cathodes, vacuum arc evaporating cold cathodes, and combinations thereof can be used as electron emitters for generating a gaseous low pressure arc plasma discharge environment. Alternatively, the conductive evaporative material itself can be used as a cathode or an anode of an ionizing arc discharge. This latter feature is provided in the vacuum cathodic arc deposition processes or in various arc plasma enhanced electron beam and thermal evaporation processes.

Deposition of a reacted coating like CrN may be accomplished by various physical vapor deposition techniques such as cathodic arc deposition, filtered arc deposition, electron beam evaporation and sputter deposition techniques. Electron beam physical vapor deposition (EBPVD) technology, both conventional and ionized, has been used in many applications, but is generally not considered a viable manufacturing technology in many fields because of batch-processing issues, difficulties of scaling up to achieve uniform coating distribution across large substrates and because of the difficulty of multi-elemental coating composition control due to thermodynamically driven distillation of the elements with different vapor pressures. In contrast, magnetron sputtering (MS) based PVD is used for a wide variety of applications due to the high uniformity of magnetron coatings at acceptable deposition rates, precise control of multi-elemental coating composition and the ability of the MS process to be easily integrated in fully automated industrial batch coating systems. Cathodic and anodic arc enhanced electron beam physical vapor deposition (EBPVD) processes dubbed hot evaporated cathode (HEC) and hot evaporated anode (HEA) respectively have demonstrated increased ionization rate, but suffer from arc spots instabilities and non-uniform distribution of the ionization rate across the EBPVD metal vapor flow. In these processes, the arc discharge is coupled with evaporation process making it difficult to provide independent control of ionization and evaporation rates in HEA and HEC processes. Therefore, it is extremely difficult to integrate PA-EBPVD processes in fully automated industrial batch coating systems.

Sputter techniques are well known in the art as being capable of cost effectively depositing thick reacted coatings although films beyond about one micron tend to develop haziness due to crystallization. The crystallization phenomenon or columnar film growth is associated with the inherent low energy of depositing atoms in sputter deposition techniques thereby creating an opportunity for energetically favored crystal structures. These crystal structures may have undesired anisotropic properties specific for wear and cosmetic applications. Various approaches have been developed over the last decade to enhance the ionization rate in a magnetron sputtering process. The main goal of these approaches is to increase the electron density along the pass of the magnetron sputtering atoms flow thereby increasing ionization of metal atoms by increasing the frequency of electron-atom collisions. The high power impulse magnetron sputtering (HIPIMS) process uses high power pulses applied to the magnetron target concurrently with DC power to increase electron emission and consequently increase the ionization rate of metal sputtering flow. This process demonstrates improved coating properties in the deposition of nitride wear resistant coatings for cutting tools. In the HIPIMS process, improved ionization is achieved only during short pulse times, while during pauses, the ionization rate is low as in conventional DC-MS processes. Since the pulse parameters are coupled with magnetron sputtering process parameters in the HIPIMS process, the sputtering rate, which is found to be almost three times lower than that of the conventional DC-MS process, can be adversely affected. Moreover, the high voltage pulses in the HIPIMS process may induce arcing on magnetron targets resulting in contamination of the growing films.

In order to generate a highly ionized discharge in a vicinity of magnetron targets, an inductively coupled plasma (ICP) source can be added in the region between the cathode and the substrate. A non-resonant induction coil is then placed parallel to the cathode in essentially a conventional DC-MS apparatus, immersed or adjacent to the plasma. The inductive coil is generally driven at 13.56 MHz using a 50Ω rf power supply through a capacitive matching network. The rf power is often coupled to the plasma across a dielectric window or wall. Inductively coupled discharges are commonly operated in the pressure range of 1-50 mTorr and applied power 200-1000 W resulting in an electron density in the range of $10^{16}$-$10^{18}$ m$^{-3}$ which is generally found to increase linearly with increasing applied power. In a magnetron sputtering discharge, metal atoms are sputtered from the cathode target using dc or rf power. The metal atoms transit the dense plasma, created by the rf coil, where they are ionized. A water cooled inductive coil placed between the magnetron target and substrates to be coated adversely affects the metal sputtering flow. The MS setup is therefore much more complicated, expensive, and difficult to integrate into existing batch coating and in-line coating system. These disadvantages are also true for the microwave assisted magnetron sputtering (MW-MS) process. In the MW-MS process, the vacuum processing chamber layout must be re-designed to allow the metal sputtering flow crossing an ionization zone. However, the RF, MW and ICP approaches to ionizing the PVD process experience difficulties with plasma distribution uniformity over a large processing area, which is an obstacle for integration into large area coating deposition systems.

Another prior art technique for producing energetic ions is plasma enhanced magnetron sputtering (PEMS) which has a thermionic hot filament cathode (HF-MS) or hollow cathode (HC-MS) as a source of ionized electrons to increase the ionization rate in the DC-MS process. In the HF-MS process, a distant thermionic filament cathode is used as a source of ionizing electrons making this process similar to the HC-MS process. However, this process typically exhibits plasma non-uniformity and is difficult to integrate in industrial large area coating systems. Moreover, both hot filaments and hollow arc cathodes are sensitive and degrade quickly in the reactive plasma atmosphere. The disadvantages of these plasma generating processes are overcome by utilizing a cold evaporative vacuum arc cathode as a source of electrons for ionization and activation of a vapor deposition processing environment.

The cosmetic appearance of the conventional cathodic arc deposited films includes particulates of un-reacted target material called macros that renders the deposited film with defects undesired in applications requiring specific wear, corrosion and cosmetic properties. However, arc deposited films do not have a crystalline character unlike sputtered films because the arc evaporation process produces highly ionized plasma with a high energy of depositing atoms believed to effectively randomize crystal structures in the developing film.

Accordingly, there is a need for additional techniques of producing energetic particles in coating processes to produce improved film properties.

SUMMARY OF THE INVENTION

The present invention solves one or more problems of the prior art by providing in at least one embodiment a system for coating a substrate. The coating system includes a vacuum chamber and a coating assembly positioned within the vacuum chamber. The coating assembly includes a vapor source that provides material to be coated onto a substrate, a substrate holder to hold substrates to be coated such that the substrates are positioned in front of the vapor source, a cathode chamber assembly, and a remote anode. The cathode chamber assembly includes a cathode target, an optional primary anode and a shield which isolates the cathode from the vacuum chamber. The shield defines openings for transmitting an electron emission current from the cathode into the vacuum chamber. The vapor source is positioned between the cathode chamber assembly and the remote anode while the remote anode is electrically coupled to the cathode. The coating system also includes a primary power supply connected between the cathode target and the primary anode and a secondary power supply connected between the cathode target and the remote anode. Characteristically, the remote anode has a linear remote anode dimension, the vapor source has a linear vapor source dimension, the cathode target has a linear cathode target dimension, and the substrate holder has a linear holder dimension such that the linear remote anode dimension, the linear vapor source dimension, the linear cathode target dimension, and the linear holder dimension are parallel to each other, with the linear remote anode dimension being equal to or greater than the linear cathode target dimension and the linear vapor source dimension such that a confined plasma streams from the cathode target to the remote anode.

In another embodiment, a method of coating a substrate in the coating system set forth above is provided. The method includes a step of generating a primary arc in the electron emitting cathode source between the cathode target and the primary anode. A confined remote arc in a coating area is generated between the cathode chamber assembly and the remote anode such that metal vapor flow from the vapor source is generated toward at least one substrate to be coated.

BRIEF DESCRIPTION OF THE DRAWINGS

Exemplary embodiments of the present invention will become more fully understood from the detailed description and the accompanying drawings, wherein:

FIG. 9A provides a schematic in which a substrate holder is positioned between an anode and a magnetron sputtering source;

FIG. 9B provides a schematic in which a wire anode is positioned between a substrate holder and a magnetron sputtering source;

DESCRIPTION OF THE INVENTION

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

Throughout this application, where publications are referenced, the disclosures of these publications in their entireties are hereby incorporated by reference into this application to more fully describe the state of the art to which this invention pertains.

Figure 1A:
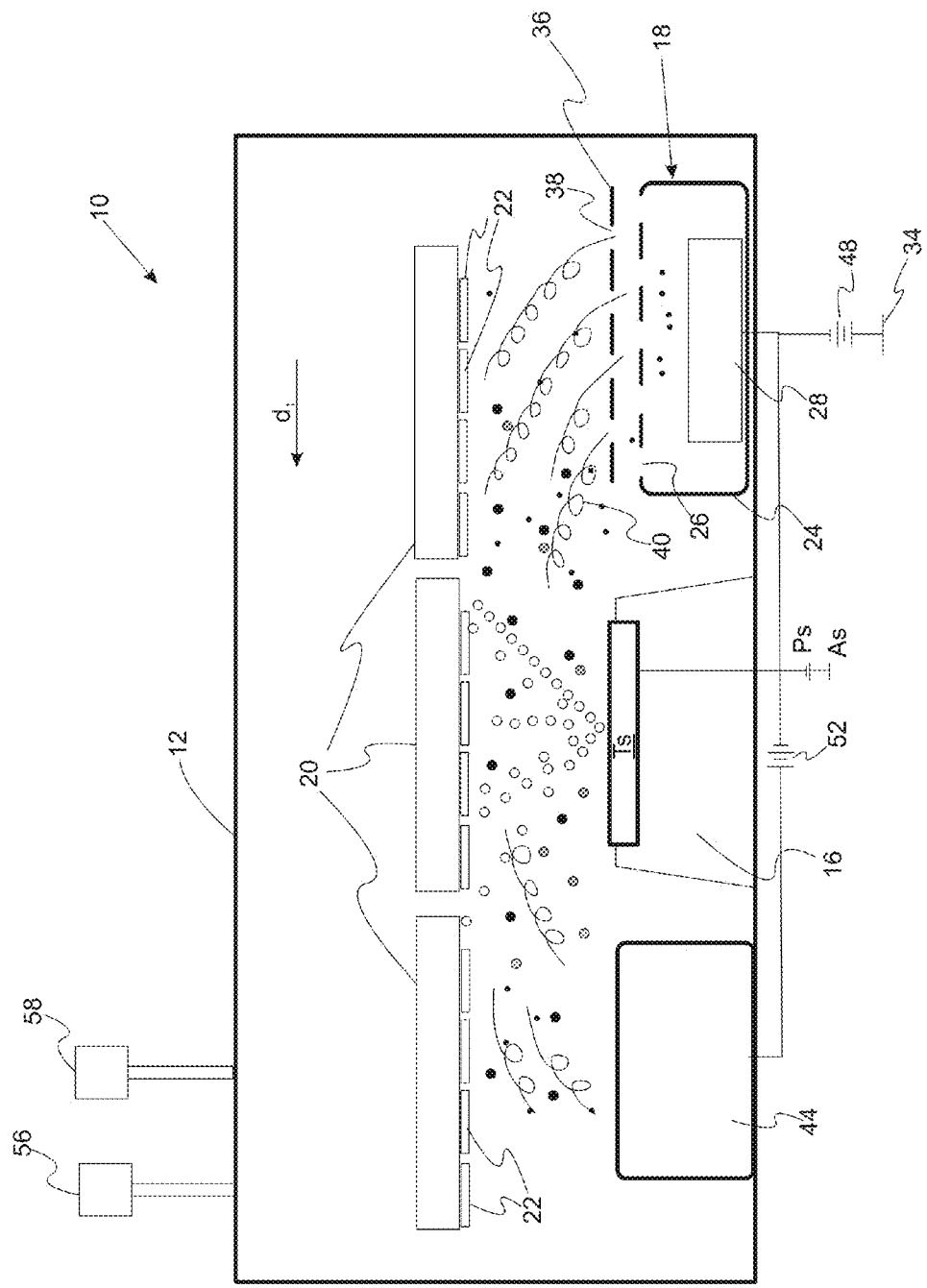
FIG. 1A is an idealized side view of a coating system using a remote arc discharge plasma.
Figure 1B:
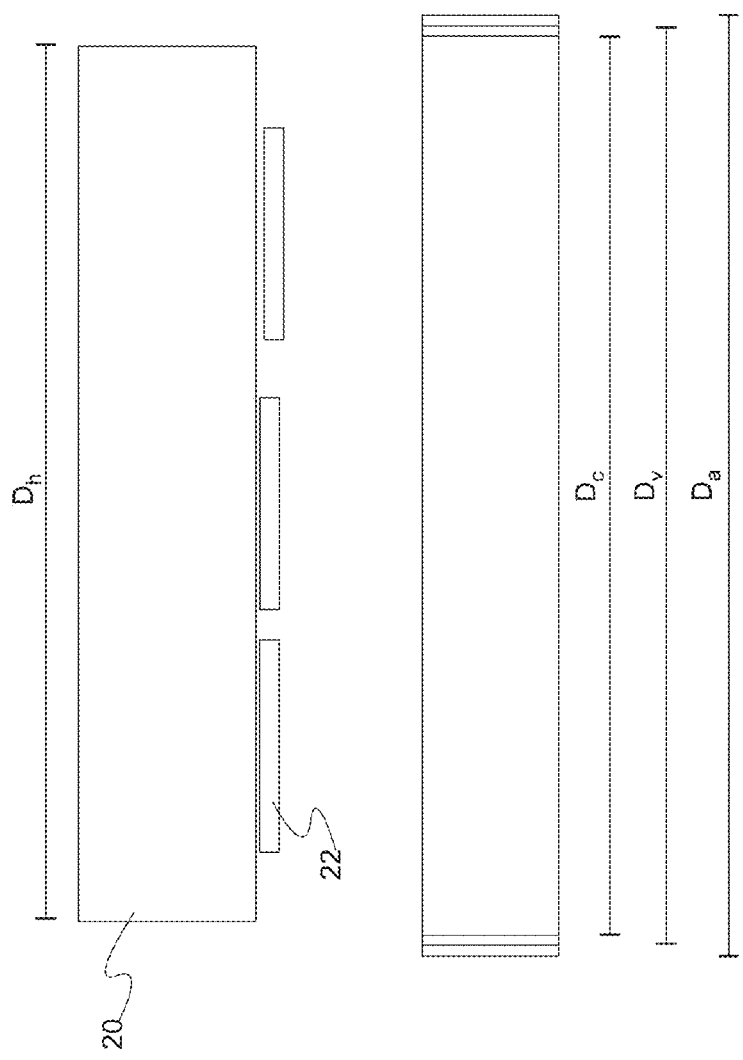
FIG. 1B is a front view of the coating system perpendicular to the view of FIG. 1A.
Figure 1C:
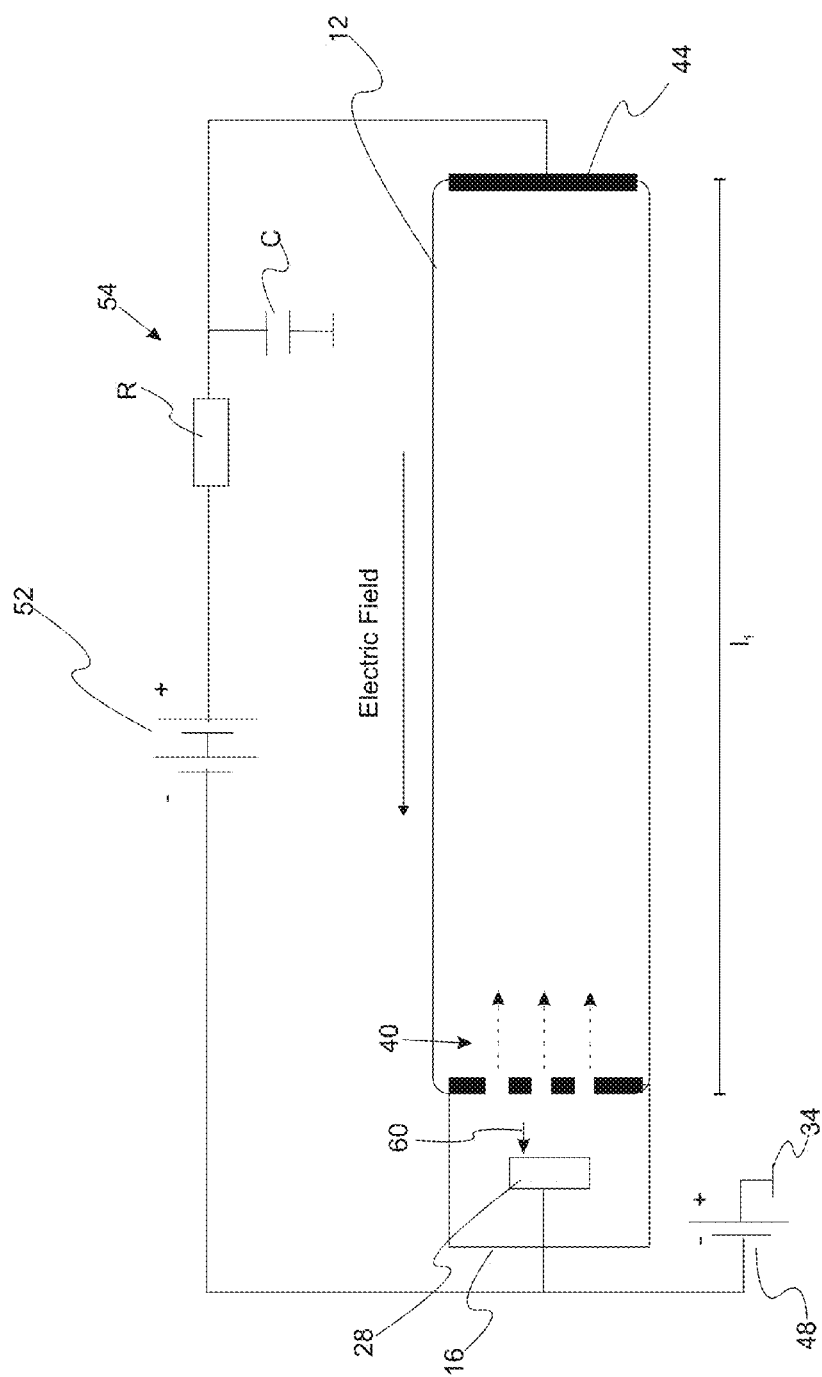
FIG. 1C is a schematic of the coating system of FIG. 1A.

With reference to FIGS. 1A, 1B, 1C and 1D, a coating system that uses a remote arc discharge plasma is provided. FIG. 1A is an idealized side view of the coating system. FIG. 1B is a front view perpendicular to the view of FIG. 1A. FIG. 1C is a schematic of the coating system including electrical wiring. The system of this embodiment is particularly useful for arc plasma enhancement of large area magnetron sputtering coating deposition processes. Coating system 10 includes vacuum chamber 12 with a coating assembly positioned therein. The coating assembly includes vapor source 16, cathode chamber assembly 18 positioned in vacuum chamber 12, and substrate holder 20 to hold substrates 22 to be coated. FIGS. 1A and 1B depict a variation in which vapor source 16 is a magnetron sputtering source so that the coating process of system 10 is a remote arc assisted magnetron sputtering (RAAMS) process. Such magnetron sputtering sources include a target Ts, a power supply Ps, and an anode As. It should be appreciated that other types of vapor sources may be utilized for vapor source 16. Examples of such vapor sources include, but are not limited to, thermal evaporators, electron beam evaporators, cathodic arc evaporators, and the like. Substrates 22 are positioned in front of the vapor source 16 during coating and move along direction $d_1$ during deposition of the coating. In a refinement, substrates may be continuously introduced from a load-lock chamber at the right of vacuum chamber 12 and received by an output chamber at the left of vacuum chamber 12 in FIG. 1A. Cathode chamber assembly 18 includes a cathode enclosure 24 with openings 26 defined therein, electron emitting cathode 28, an optional separate primary anode 34 and shield 36. Shield 36 isolates electron emitting cathode 28 from vacuum chamber 12. In a refinement, optional separate anode 34, cathode enclosure 24, shield 36, or a ground connection operate as the primary cathode-coupled anode.

Cathode chamber assembly 18 operates as an electron emitting cathode source in the context of the present embodiment. In a refinement, a primary arc is generated in the electron emitting cathode source between cathode 28 and the primary anode. The cathode enclosure 24 can serve both as an independent primary anode connected to the positive pole of the primary arc power supply 48 and as a grounded anode, when it is connected to the ground 34. Shield 36 defines openings 38 for transmitting electron emission current 40 from cathode 28 into vacuum chamber 12. The shield can be floating or it can be connected to the positive pole of either primary arc power supply 48 or an additional power supply (not shown). In another refinement, cathode 28 is a cathodic arc cathode and the grounded primary anode 34 is a cathodic arc anode. Any number of different cathodes may be used for electron emitting cathode 28. Examples of such cathodes include, but are not limited to, cold vacuum arc cathodes, hollow cathodes, thermionic filament cathodes, and the like, and combinations thereof. Typically, the cathode target is made of metal having a gettering capability including titanium and zirconium alloys. In a refinement, the shield of the cathode chamber is water cooled and negatively biased in relation to the cathode target wherein the bias potential of the shield ranges from −50 volts to −1000 volts. In still another refinement, cathode chamber assembly 18 includes a cathode array having a plurality of cathode targets installed therein with the height of cathode target array being substantially the same height of the remote anode and the height of a deposition area. Separation from the top of the cathode chamber assembly or vapor source 16 to substrates 22 (i.e., top of the substrates) is such that the plasma streaming from cathode 28 to remote anode 44 is confined. Typically, separation distance from the shield 36 of the cathode chamber assembly or from the evaporation surface of the vapor source 16 or from the remote anode 44 to substrates 22 is from about 2 inches to about 20 inches, which result in a formation of a narrow corridor for confinement of the remote arc plasma between the cathode 28 in a cathode chamber 18 and the remote anode 44. When the width of this corridor is less than 2 inches it creates high impedance in plasma leading to plasma instabilities and eventually extinguishing of the remote arc discharge. When the width of this corridor is greater than 20 inches the plasma density in the remote arc discharge is not increasing enough to ionize the metal sputtering flow. In a particularly useful refinement, a large area cathode target having a shape of plate or bar is installed in the cathode chamber assembly 18. Typically, such a large area cathode target has a height that is substantially equal to the height of the anode and the height of a deposition area. In a refinement, the cathode target can be made of the metal having a gettering capability such as for example titanium alloy or zirconium alloy. In this case the shielded cathode electron emitting source can also serve as a vacuum gettering pump which can improve pumping efficiency of the coating system. To further improve the gettering pumping efficiency the shield 36 facing the evaporating surface of the cathode target 28 in the cathode chamber 18 can be water cooled and optionally connected to high voltage bias power supply. When the water cooled shield 36 is biased to high negative potential ranging from −50V to −1000V in relation to the cathode target 28, it will be subjected to intense ion bombardment by metal ions generating by the cathodic arc evaporating process. Condensation of metal vapor under conditions of intense ion bombardment is favorable for pumping noble gases such as He, Ar, Ne, Xe, Kr as well as hydrogen.

System 10 also includes remote anode 44 electrically coupled to cathode 28, primary power supply 48 connected between cathode 28 and the primary cathode-coupled anode. Remote anode 44 is positioned in vacuum chamber 12 such that vapor source 16 is positioned between cathode chamber assembly 18 and the remote anode. In a refinement, a plurality of vapor sources is positioned between cathode chamber assembly 18 and remote anode 44 as set forth below in more detail. System 10 also includes secondary power supply 52 which electrically couples cathode 28 to remote anode 44. Low pass filter 54 is also depicted in FIG. 1A which includes resistor R and capacitor C. Typically, vapor source 16 is positioned between cathode chamber assembly 18 and remote anode 44. System 10 further includes pumping system 56 for maintaining a reduced pressure and gas system 58 for introducing one or more gases (e.g., argon, nitrogen, helium, etc.) into deposition chamber 12. In a refinement, secondary power supply 52, which powers the distant arc discharge in coating chamber 12 is installed between cathode chamber assembly 18 and remote anode 44 and provides at least 20% higher open circuit voltage than primary power supply 48.

Figure 1D:
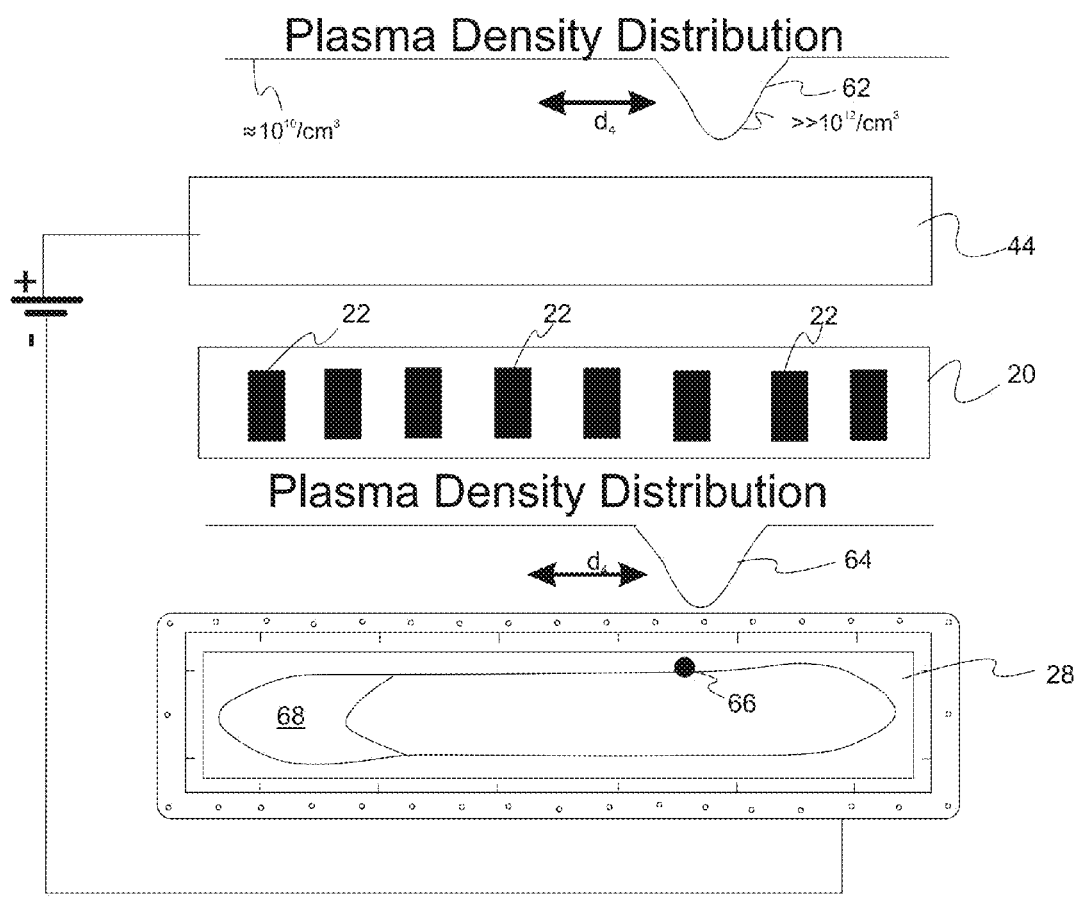
FIG. 1D is a schematic illustration showing confinement of the plasma jet streaming between the cathode and remote anode.
Figure 1E:
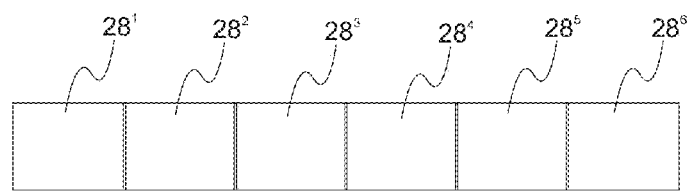
FIG. 1E is a schematic of a multi-element cathode used to raster a plasma jet.
Figure 2:
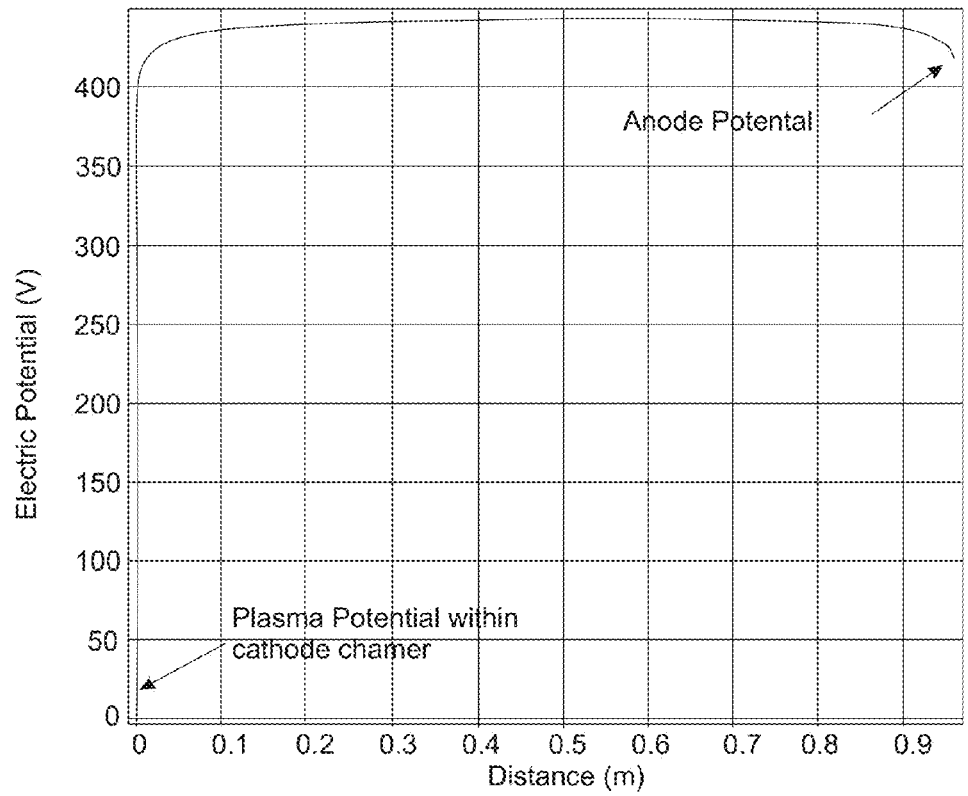
FIG. 2 provides a typical distribution of the plasma potential between the screen and the remote anode obtained by finite element modeling.

Still referring to FIGS. 1A, 1B, 1C, and 1D, a primary arc is initiated by arc igniter 60 in a cathode chamber 24 isolated from the discharge chamber by shield 36 with openings 38 for transmission of the electron current 40. Typically, the plasma potential near the screen is low, close to the plasma potential in cathode chamber assembly 18, while in the remote arc discharge plasma, the electric potential is high, close to the electrical potential of remote anode 44. FIG. 2 provides a typical distribution of the plasma potential between the screen and the remote anode obtained by finite element modeling. Surprisingly, the present coating system is found to produce a confined plasma arc that streams from cathode chamber assembly 18 to remote anode 44. FIG. 1D provides a schematic illustration showing the movement of the plasma density between remote anode 44 and cathode 28. A confined plasma streams (i.e., a plasma jet) between the remote anode and the cathode through the coating region. The ends of the confined plasma move along direction $d_4$ as set forth in FIG. 1D. An arc spot 66 forms on cathode 28 along with erosion zone 68 The plasma field 62 at remote anode 44 and the plasma field 64 at cathode 28 are confined dimensionally in a space from about 1 to 5 inches along direction $d_4$. In one refinement, magnetic fields are used to accomplish the rastering movement along $d_4$. In other refinement, this rastering movement is accomplished by mechanically moving cathode 28 along direction $d_4$. In still other refinements, an emission filament bombarding cathode with electrons is moved along $d_4$. In still other refinements as shown in FIG. 1E, the cathode includes a plurality of cathode elements $28^{1-6}$ which are sequentially activated in order to form a plasma jet moving along $d_4$. The confinement of the plasma arc results in a high density and hot plasma jet connecting cathodic arc spots at the primary cathode with an associated area at the remote anode running through a relatively narrow corridor created between the chamber walls (with primary cathodes, anodes and magnetrons attached) and substrate holder. This results in a high current density in the moving plasma jet connecting the cathode and remote anode. In a refinement, the current density in RAAMS plasma within this narrow corridor is from 0.1 mA/cm² up to 100 A/cm². Typically, the electron density $n_e$ in the background remote arc plasma ranges from about $n_e \sim 10^8$ cm$^{-3}$ to about $n_e \sim 10^{10}$ cm$^{-3}$ while within the confined arc plasma jet area the electron density ranges from about $n_e \sim 10^{10}$ cm$^{-3}$ to about $n_e \sim 10^{13}$ cm$^{-3}$. The confinement creating the plasma jet is a result of the physical dimensional relations between the components as set forth below as well as the application of magnetic fields. In particular, the discharge operates at very high plasma potential which corresponds to a high energy of ion bombardment (i.e., the ion bombardment energy is the difference between the plasma potential (vs. ground) and the substrate bias potential (vs. ground)). Even at floating and grounded substrates, ions with 50-70 eV are obtained because the plasma potential is above 50 V. In a refinement, the plasma potential is from 5V to 500V.

With reference to FIGS. 1A and 1B, an aspect of the relative sizing of various components of coating system 10 is provided. Remote anode 44 has a linear remote anode dimension $D_a$. Vapor source 16 has a linear vapor source dimension $D_v$. Cathode target Ts has a linear cathode target dimension $D_c$. Substrate holder 20 has a linear holder dimension $D_h$. In a refinement, the linear remote anode dimension $D_a$, the linear vapor source dimension $D_v$, the linear cathode target dimension $D_c$. and the linear holder dimension $D_h$ are parallel to each other. In another refinement, the linear remote anode dimension $D_a$ is greater than or equal to the linear vapor source dimension $D_v$ which is greater than or equal to the linear cathode target dimension $D_c$ which is greater than or equal to the linear holder dimension $D_h$.

In a variation of the present embodiment, several distant anodes are associated with (i.e., electrically coupled to) at least one arc cathode positioned in the shielded cathodic chamber assembly 18. The distant anodes are positioned at strategic positions within the coating chamber.

In another variation, the perpendicular distances between each of the vapor sources (e.g., vapor source 16) and substrates 22 to be coated is substantially equal. Moreover, in a further refinement, the distance between cathode 28 and remote anode 44 is less than the distance at which breakdown occurs when an applied voltage of secondary power supply 52 exceeds 1.2 to 30 times the applied voltage of primary power supply 48.

In still another refinement of the present embodiment, plasma probes are installed between the cathode 28 and remote anode 44 to measure plasma density. Such measurements provide a feedback so that the second power supply 52 is adjusted to provide adjusting a remote anode current to remote anode 44 to obtain a uniform distribution of the plasma density between cathode chamber assembly 18 and remote anode 44.

Figure 3:
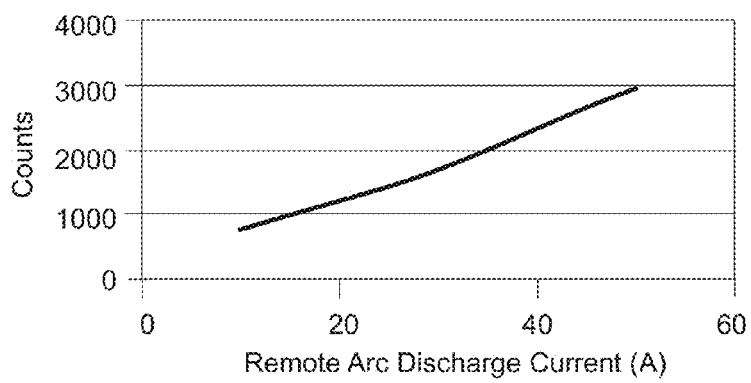
FIG. 3 provides the intensity of the radiation emitted by excited argon atoms (spectral line ArI 739.79 nm) from the remote arc discharge plasma versus the discharge current.

Remote arc plasma modeling of the present embodiment is characterized by the electric potential distribution between cathode chamber assembly 18 and remote anode 44 and by the plasma density in the remote arc discharge plasma. The plasma potential in the remote arc discharge plasma and the anode potential increase as the remote discharge current increases. The plasma density in the remote arc discharge plasma increases almost proportional to the discharge current. This result is verified by optical emission spectroscopy of the remote arc discharge plasma. FIG. 3 shows the intensity of the radiation emitted by excited argon atoms (spectral line ArI 739.79 nm) from the remote arc discharge plasma versus discharge current. It can be seen that the intensity of light emission from the argon atoms excited by direct electron impact is nearly proportional to the discharge current. This phenomenon is explained by the direct proportional relationship between electron concentration in the remote arc plasma and the remote arc discharge current. The ion concentration in the remote arc discharge is nearly equal to the electron concentration such that plasma quasi-neutrality is maintained.

Figure 4A:
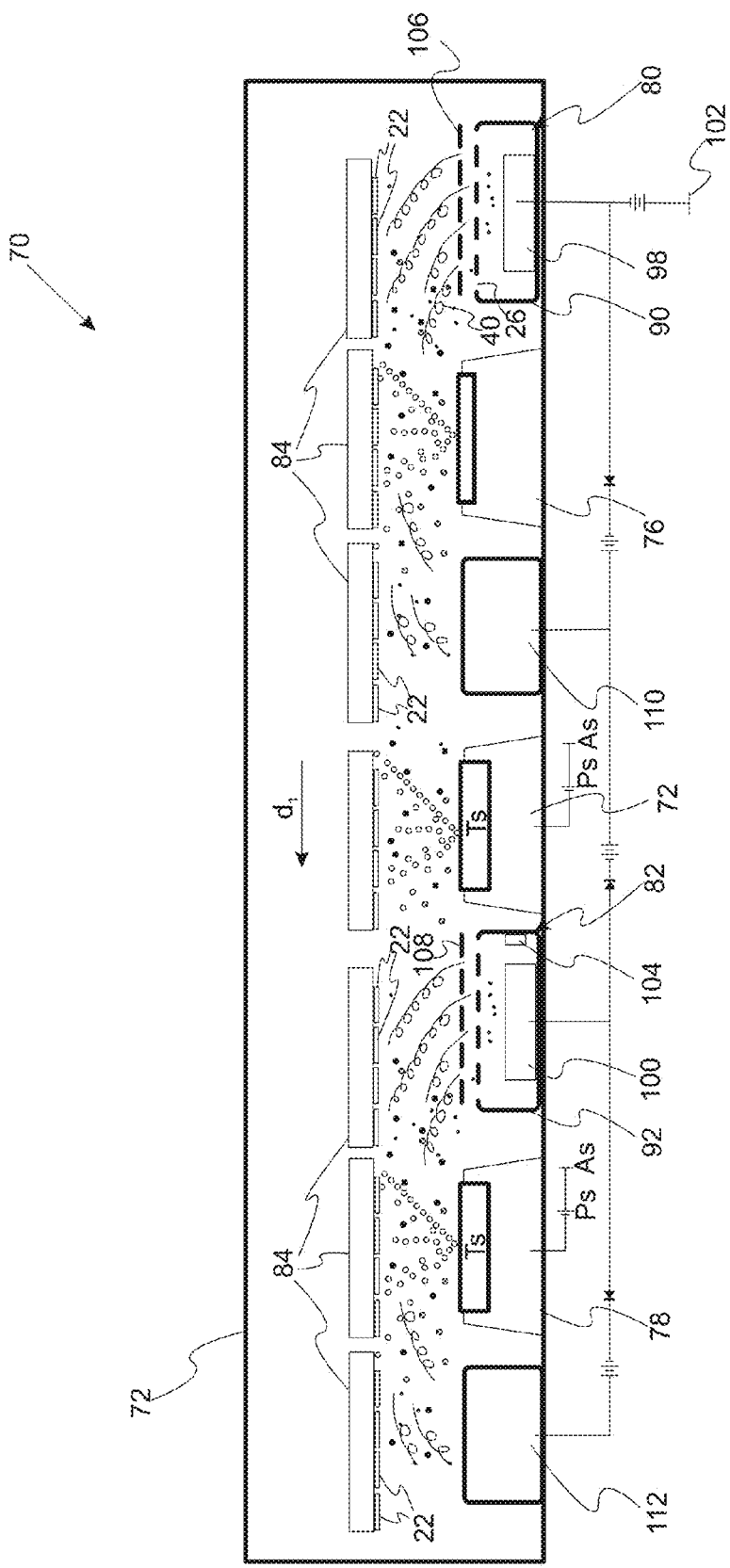
FIG. 4A provides a schematic of a coating system having additional distant anodes positioned between the magnetron sputtering source with additional shielded cathode chamber assemblies added to secure the uniformity and high ionization of a gaseous plasma environment.
Figure 4B:
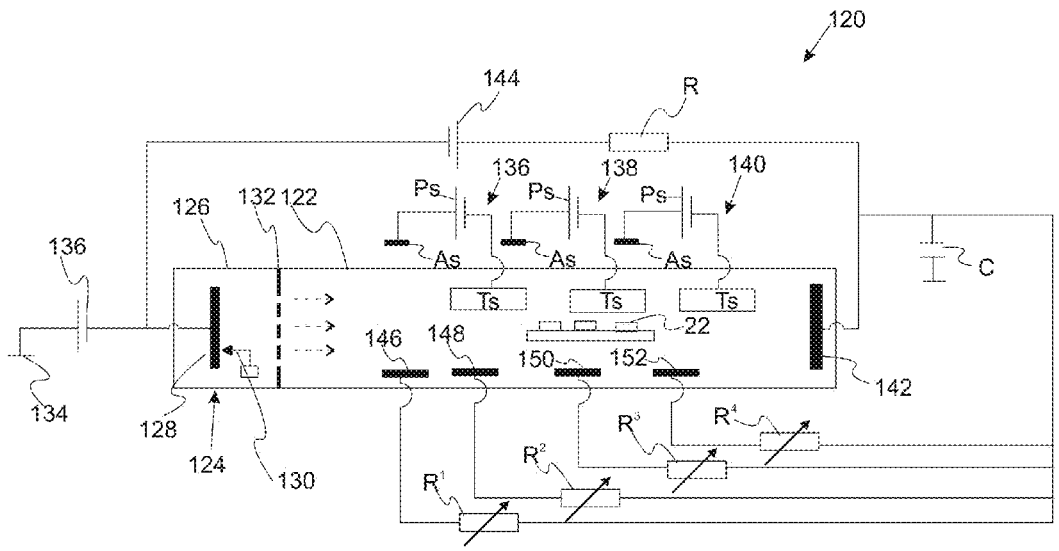
FIG. 4B provides a schematic illustration of a coating system which includes variable resistors installed between a master anode and each of a plurality of slave anodes.
Figure 4C:
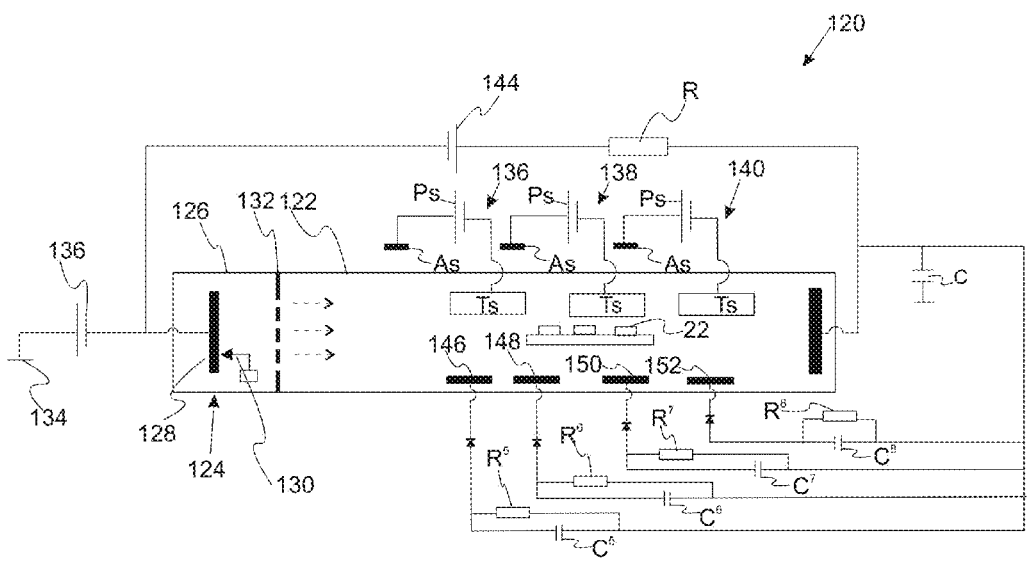
FIG. 4C provides a refinement in which a resistor in parallel with a capacitor is used to set the voltage potentials of the intermediate anode.

With reference to FIGS. 4A, 4B and 4C, variations of the present embodiment with a chain of magnetron sputtering sources installed inline between a shielded cathode chamber assembly on one side and a distant arc anode on the other side is provided. In this context, the term "inline" means that the components are linearly arranged such that the substrates may pass over the components while moving in a linear direction. FIG. 4A provides a schematic of a coating system having additional distant anodes positioned between the magnetron sputtering source with additional shielded cathode chamber assemblies added to secure the uniformity and high ionization of gaseous plasma environment. Deposition system 70 includes vacuum chamber 72 with associated vacuum and gas supply systems as set forth above. Deposition system 70 also includes vapor sources 76 and 78, cathode chamber assemblies 80 and 82, and substrate holder 84 to hold substrates 22 to be coated. FIG. 4A depicts a variation in which vapor sources 76, 78 are magnetron sputtering sources. The substrates are positioned in front of the vapor sources during coating. Typically, substrates 22 move along direction $d_1$ during deposition of the coating. Cathode chamber assemblies 80 and 82, respectively, include cathode enclosures 90 and 92 with openings 94 and 96 defined therein, cathodes 98 and 100, optional primary anodes 102 and 104, and shields 106, 108. Shields 106, 108 respectively isolate cathodes 98, 100 from vacuum chamber 72. Shields 106, 108 each define openings for transmitting electron emission currents into vacuum chamber 72. In a refinement, cathodes 98, 100 are cathodic arc cathodes and primary anodes 102, 104 are cathodic arc anodes. System 70 also includes remote anodes 110, 112, respectively, electrically coupled to cathodes 98, 100. In a refinement as depicted in FIG. 4A, the shielded cathode chamber assemblies, the vapor sources (e.g., magnetron targets) and the remote anodes are aligned along the straight line which is suitable for the in-line coating systems.

FIG. 4B provides a schematic illustration of a coating system which includes variable resistors installed between a master anode and each of a plurality of slave anodes. In this refinement, coating system 120 includes vacuum chamber 122 and cathode chamber assembly 124 which is of the general design set forth above. Cathode chamber assembly 124 includes cathode chamber 126, cathode 128, arc igniter 130, shield 132 defining a plurality of openings therein, and optional primary anode 134. System 120 also includes primary power supply 136 which connects cathode 128 and primary anode 134 and magnetron sputtering sources 136, 138, 140. Each magnetron sputtering source has a target Ts, a power supply Ps and an associated counter-electrode system 120 which also includes remote anode 142 with secondary power supply 144 providing a voltage potential between cathode 128 and remote anode 142. System 120 also includes slave anodes 146, 148, 150, 152 which are at intermediate voltage potentials established by variable resistors $R^1, R^2, R^3$, and $R^4$. In this refinement, the density of the plasma distribution can be controlled by changing the current through each of the slave anodes using variable resistors $R^1, R^2, R^3$, and $R^4$. The distances between the slave anodes and the distance between the slave anode closest to the master anode and the master anode cannot be greater than the minimal distance of the plasma discharge interruption in a processing gas composition and pressure.

FIG. 4C provides a refinement in which a resistor in parallel with a capacitor is used to set the voltage potentials of the intermediate anode. In this refinement, resistor $R^5$ in parallel with $C^5$ sets the voltage potential for anode 146, resistor $R^6$ in parallel with $C^6$ sets the voltage potential for anode 148, resistor $R^7$ in parallel with $C^7$ sets the voltage potential for anode 150, and resistor $R^8$ in parallel with $C^8$ sets the voltage potential for anode 152. In this refinement, the capacitors are used to extend the RAAMS process along the large distance by pulse igniting of the remote arc discharges between the cathode in a cathode chamber and each of the slave anodes positioned between the cathode in a cathode chamber and the master anode. It is appreciated that slave anodes can be also provided with additional independent power supplies; each of the slave anode power supply can be installed between the cathode 128 and the corresponding slave anode. The open circuit voltage of each secondary power supply connected either to the master anode or to the slave anode exceeds at least 1.2 times the open circuit voltage of the primary arc power supply 136.

Figure 5:
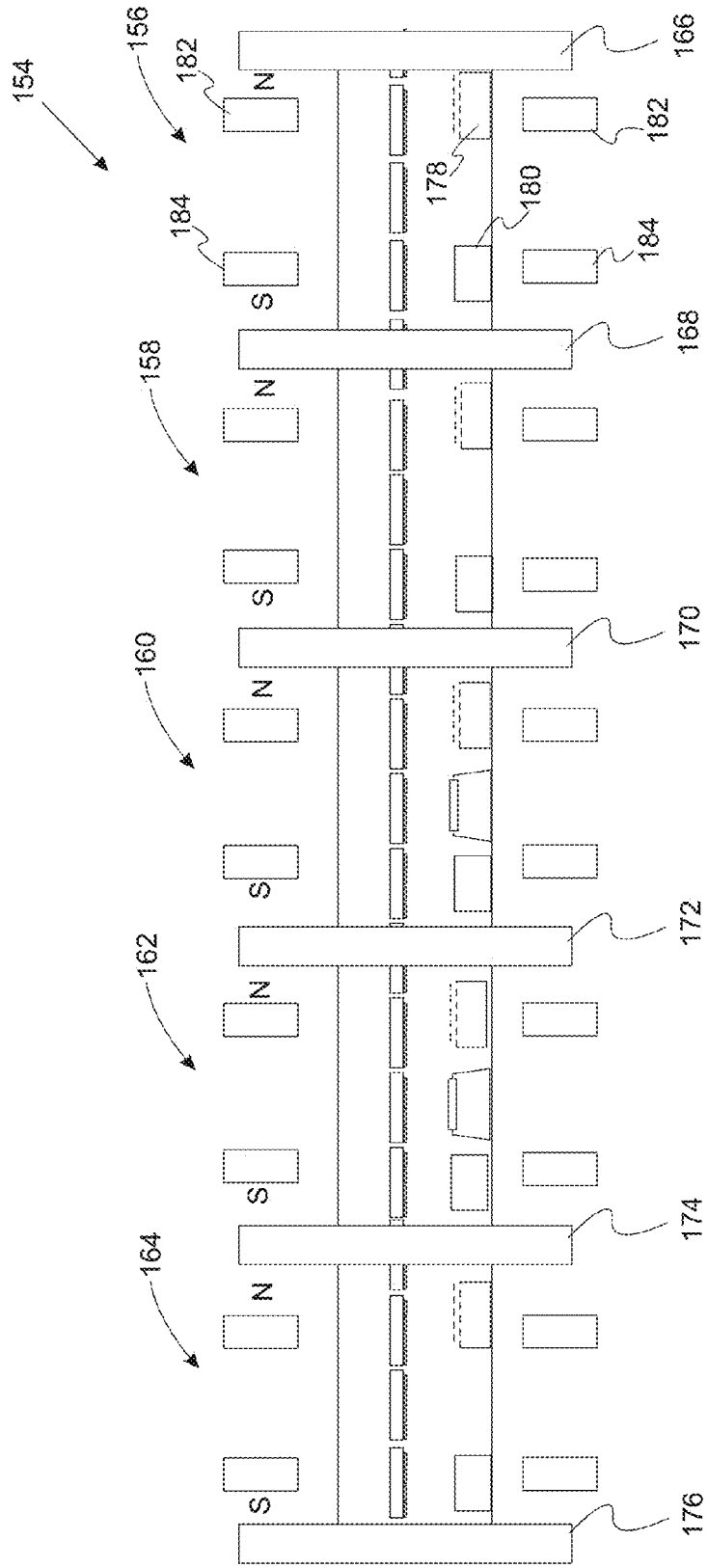
FIG. 5 provides a schematic illustration of an inline modular configuration of a RAAMS system.
Figure 6:
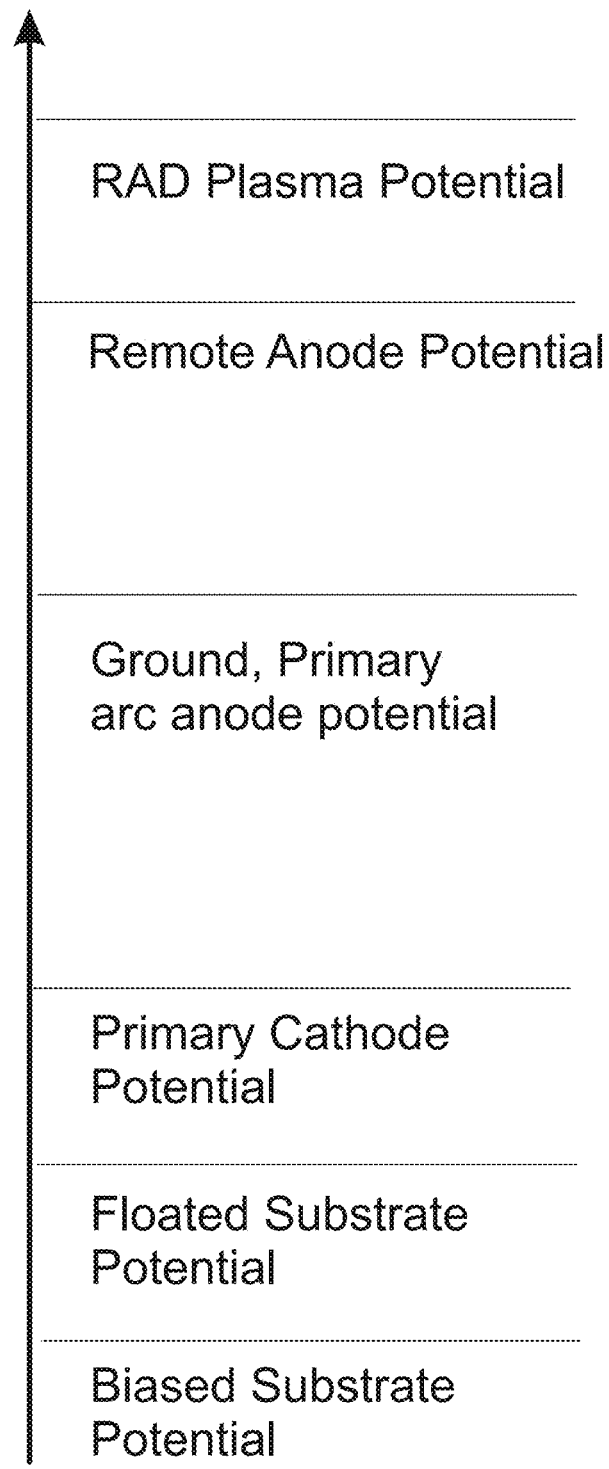
FIG. 6 provides a diagram of potential distribution in RAD plasma processing.

In still another variation of the invention, an inline modular configuration of the RAAMS setup is provided in FIG. 5. Such an inline system may include any number of deposition stations and/or surface treatment stations (e.g., plasma cleaning, ion implantation carburizing, nitriding, etc.). In the variation depicted in FIG. 5, coating system 154 includes modules 156-164 which are aligned inline. Modules 156-164 are separated from the neighboring module by load-lock gate valve 166-176. Modular RAAMS surface engineering system 154 includes module 156 which is a chamber-module having a shielded cathodic arc chamber 178 and a remote anode 180 positioned along one wall of the chamber as set forth above. An optional set of magnetic coils 182, 184 which create a longitudinal magnetic field ranging from 1 to 100 Gs along the coating chamber is also shown in this Figure. This module 156 performs the following operations: substrate loading; ion etching or ion cleaning of the substrates by high energy (typically E>200 eV) ion bombardment in an argon with a remote anode arc discharge (RAAD) plasma generated between the cathode in a shielded cathode chamber and a remote anode; and conditioning of the substrates to be coated by soft ion bombardment (typically E<200 eV) in an argon RAAD plasma generated between the cathode in a shielded cathode chamber and a remote anode. Second module 158 ionitrides the substrate surfaces to be coated in nitrogen or argon-nitrogen mix RAAD plasma generated between the cathode in a shielded cathode chamber and remote anode. The rate of plasma immersion ionitriding of HSS, M2 and 440C steel in the RAAD plasma immersion ionitriding process reaches 0.5 to 1 µm/min at pressures from 0.1 mtorr to 200 mtorr and a remote anode current ranging from 10 to 300 amps, but typically within the pressure range 0.2-100 mtorr and remote anode range from 10 to 200 amps. The RAAD plasma immersion ionitriding is a low temperature treatment where substrate temperature typically does not exceed 350° C. In this process, the substrates may be floating, grounded or biased at very low negative bias voltages (e.g. below −100V). Ionitriding at such low bias voltages is due to the high positive RAAD plasma potential causing the plasma ions to receive excessive energy from the high plasma potential which exceeds the grounded substrate potential. Alternatively, a low energy ion implantation of such elements as nitrogen, phosphorus, silicon, carbon from the gaseous RAAD plasma can be also performed at relatively low substrate bias voltages typically ranging from −200 to −1500 volts. The diagram of potential distribution in RAAD plasma processing is illustrated in FIG. 6. In a typical RAAD plasma process, the primary cathode has potential ranging from −20 to −50 volts relative to the ground primary anode. In a refinement, the floating substrate potential ranges from −10 to −50 volts relative to the primary cathode. The biased substrate potential in ionitriding, carburizing and other ion diffusion saturation processes is typically from −10 to −200 V relative to the primary cathode, while in the RAAD plasma immersion low energy ion implantation process, the substrate bias is typically from −200 to −1500 volts.

It is appreciated that the modular chamber layout of FIG. 5 can also be used to perform remote anode arc plasma assisted CVD (RAACVD) processes in gaseous RAAD plasma chambers (for instance, modules 156, 158 and 164 in FIG. 5). For example, this low pressure plasma immersion CVD process setup can be used for deposition of polycrystalline diamond coatings in the plasma-creating gas atmosphere consisting of 0.1-1% methane and balance hydrogen or hydrogen-argon mix. RAAD plasma acts as a powerful activator of the reactive atmosphere with high density of atomic hydrogen and HC radicals which are contributing to formation of polycrystalline diamond coating. In this process the substrate to be coated can be either grounded, floating or biased to the negative potential not below −100 volts vs. the primary cathode. Independent radiation heater array can be used to maintain substrate temperature in the range from 200° C. to 1000° C. as necessary for the deposition of polycrystalline diamond coating in the plasma enhanced low pressure CVD processes.

Figure 7A:
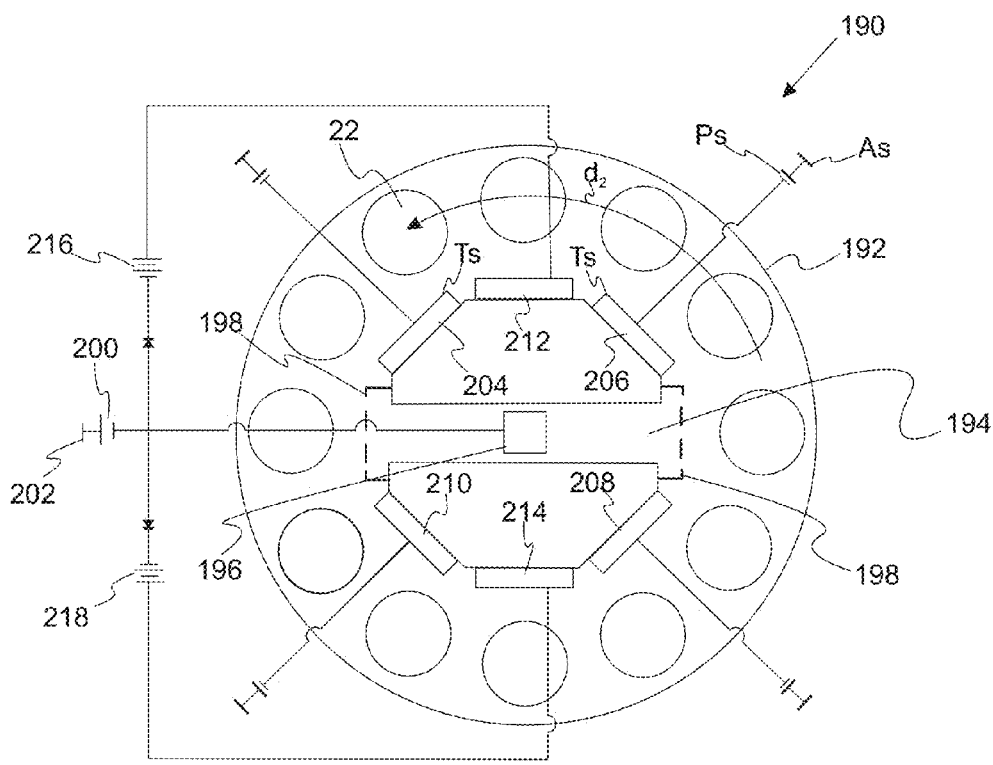
FIGS. 7A and 7B provide a schematic illustration of a batch coating system with a centrally located shielded cathode chamber.
Figure 7B:
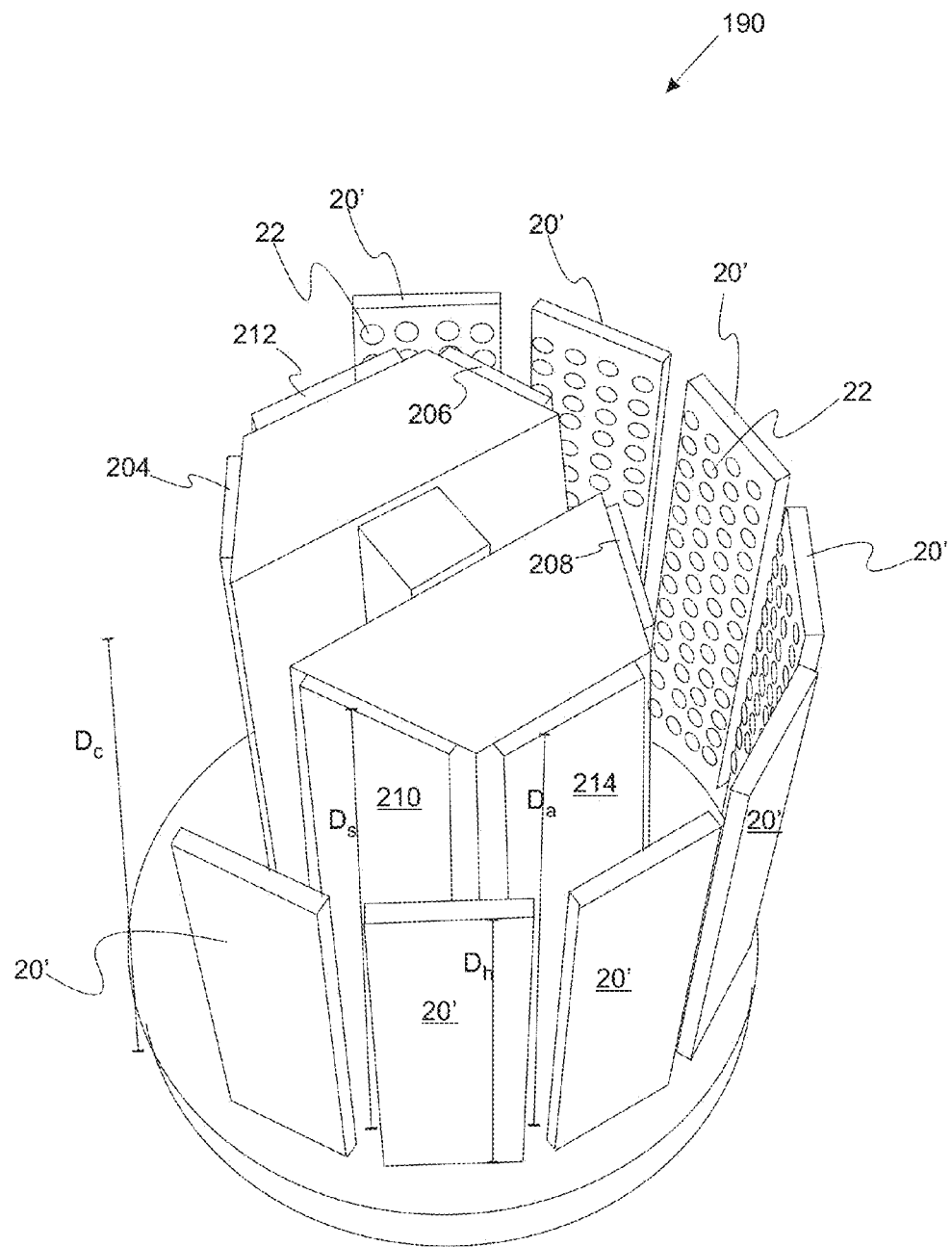

In another embodiment, a coating system having plasma sources aligned along curvilinear walls is provided. FIG. 7A provides a schematic top view of a batch coating system with a centrally located shielded cathode chamber. FIG. 7B provides a schematic perspective view of the batch coating system of FIG. 7A. Coating system 190 includes vacuum chamber 192, cathode chamber 194 which includes cathode 196, and shield 198. Vacuum chamber 192 has a substantially circular cross section. System 190 also includes primary power supply 170 which sets the voltage potential between cathode 196 and primary anode 202. System 190 also includes magnetron sputtering sources 204-210 each of which includes target Ts, power supply Ps, and anode As. In a refinement, magnetron sputtering sources 204-210 are arranged along a circle having the same center as the cross section of vacuum chamber 192. System 190 also includes remote anodes 212 and 214 which are set at a voltage potential relative to cathode 194 by power supplies 216 and 218. In this embodiment, substrates 22 move axially along a circular direction $d_2$ as they are coated. In each of the variations of FIGS. 7A and 7B, the plasma streams between cathode 196 and the remote anodes. This streaming is confined by the separation between the remote anode (or sputtering sources) and the substrates (i.e., top of the substrates) which is typically 2 to 20 inches. The confinement persist through the coating zone Moreover, the plasma is rastered along the cathode in a direction perpendicular to the movement of the substrates as set forth above with respect to FIG. 1D.

As set forth above, remote anodes 212 and 214 have a linear remote anode dimension $D_a$. Magnetron sputtering sources 204-210 have linear source dimension $D_s$. Cathode target 196 has a linear cathode target dimension $D_c$. Substrate holder 20 has a linear holder dimension $D_h$. In a refinement, the linear remote anode dimension $D_a$, the linear cathode target dimension $D_c$. and the linear holder dimension $D_h$ are parallel to each other. In another refinement, the linear remote anode dimension $D_a$ is greater than or equal to the linear cathode target dimension $D_c$ which is greater than or equal to the linear holder dimension $D_h$.

Figure 8:
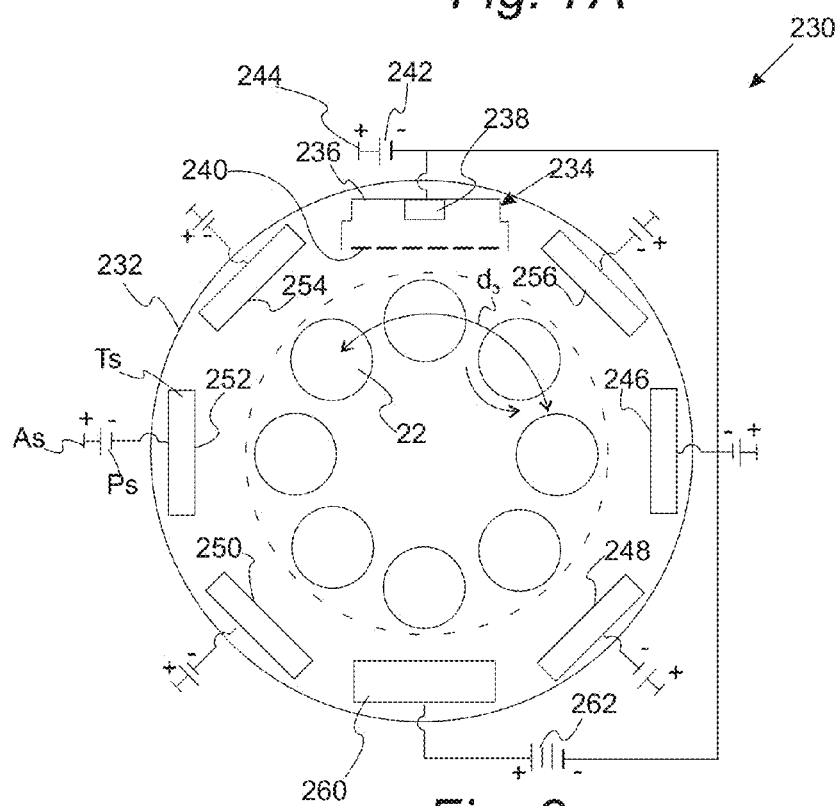
FIG. 8 provides a schematic of a batch coating system with a peripherally located shielded cathode chamber assembly.

With reference to FIG. 8, a schematic of a batch coating system with a peripherally located shielded cathode chamber assembly is provided. Coating system 230 includes vacuum chamber 232, cathode chamber assembly 234, which includes cathode chamber 236, cathode 238 and shield 240. System 230 also includes primary power supply 242 which sets the voltage potential between cathode 238 and primary anode 244. System 230 also includes magnetron sputtering sources 256-266 each of which includes target Ts, power supply Ps, and anode As. System 230 also includes remote anode 260 which is set at a voltage potential relative to cathode 238 by power supply 262. In this embodiment, substrates 22 move axially along direction $d_3$ as they are coated.

It is appreciated that an external magnetic field can be applied in a coating chamber for the embodiments set forth above to further enhance the plasma density during arc plasma enhanced magnetron sputtering coating deposition processes. The preferable magnetic field will have magnetic field lines aligned generally parallel to the cathodic arc chamber and/or distant anode. This will contribute to the increase of the arc discharge voltage and, consequently, to the electron energy and arc plasma propagation length along the coating chamber. For example, the external magnetic field can be applied along the coating chambers in the inline coating system shown in FIG. 5. In a refinement, the external magnetic field is applied to magnetically insulate the cathode target of the cathode chamber assembly. In another refinement, the external magnetic field is applied to magnetically insulate the remote anode.

A uniform plasma density distribution in the coating chambers set forth above can be achieved by appropriately distributing both distant anodes and the electron emitting surface of the shielded vacuum arc cathode targets to evenly cover the coating deposition area. For example, if coating deposition area is 1 m high then both electron emitting surfaces of the shielded cathode target and electron current collecting remote anode surfaces have to be distributed to evenly cover this 1 m high coating deposition area. To achieve these requirements, several small cathode targets can be installed in a shielded cathode chamber, each of the cathode targets is connected to the negative pole of the independent power supply. The cathode targets are distributed generally evenly so the electron flows emitted by each of the cathode targets overlap outside the shielded cathode chamber providing a generally even distribution of electron density over the coating deposition area. The positive poles of the remote arc power supplies can be connected to one large anode plate having the height generally the same as a height of the coating deposition area and facing the substrate holder with substrates to be coated as shown in FIGS. 1 and 4-6. The set of anode plates, each connected to the positive pole of the remote arc power supplies, can be used to provide even distribution of electron density over the coating deposition area. Similarly, instead of using a set of small cathode targets in a shielded cathode chamber, a single large cathode target having a linear dimension similar to the linear dimension of the coating deposition area can be used as a cathode of remote arc discharge. In this case, electron emission spots (i.e., cathodic arc spots) are rastered over the cathode target to provide a generally even distribution of electron emission current over the coating deposition area. The rastering of the cathodic arc spots over a large cathode target area can be achieved, for example, by magnetic steering of the cathodic arc spots over the arc evaporating area of the cathode target or by mechanical movement.

FIGS. 9A and 9B provide alternative configurations of remote plasma systems. With reference to FIG. 9A, coating system 270 includes substrate holder 272 positioned between magnetron sputtering source 274 and anode 276. Coating system 270 also includes cathode chamber 278 which is of the design set forth above. This configuration increases remote arc plasma density thereby providing a higher ion bombardment assistance rate during magnetron sputtering. With reference to FIG. 9B, coating system 280 includes anode 282 which is composed of thin wires. Anode 282 is installed between magnetron target 284 and substrate holder 286. Coating system 280 also includes cathode chamber 288 as set forth above. In this latter configuration, a denser zone of the remote arc discharge plasma is created in the gap between the magnetron target and substrates to be coated.

Figure 10A:
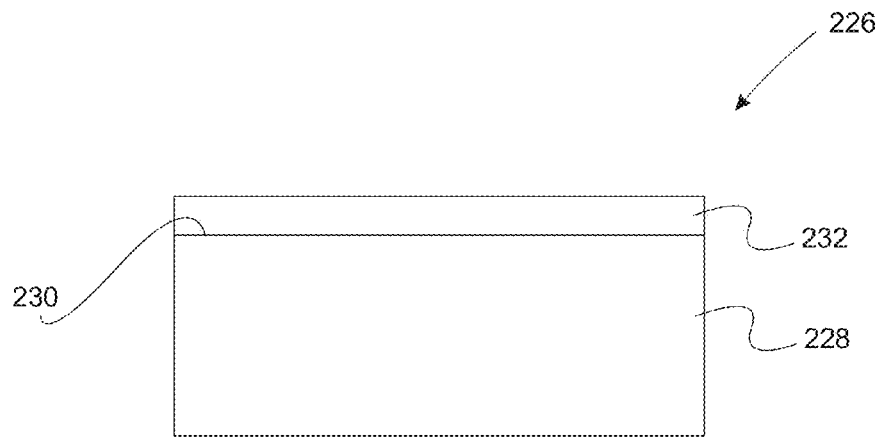
FIG. 10A is a schematic of a substrate with a coating made by a remote arc discharge plasma assisted process.
Figure 10B:
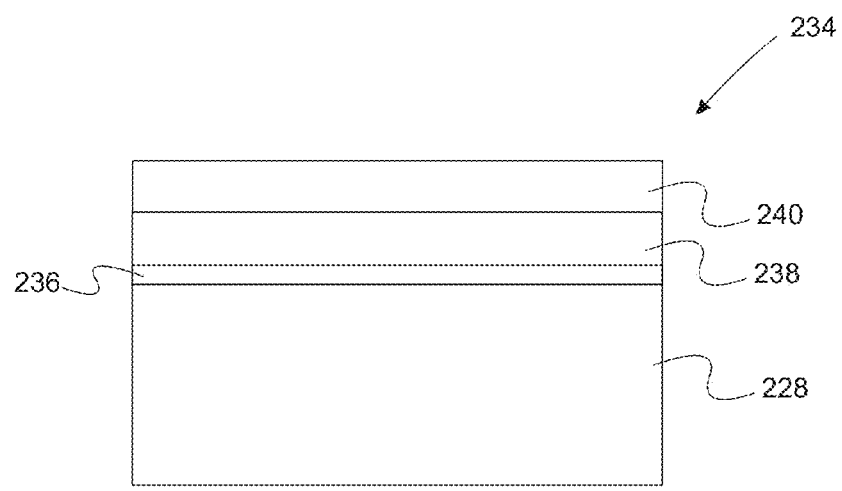
FIG. 10B is a schematic of a substrate with a multilayer coating made by a remote arc discharge plasma assisted process.

In another embodiment, a coated article formed by the methods and systems set forth above is provided. With reference to FIG. 10A, coated article 226 comprises substrate 228 having surface 230 and coating 232 disposed over surface 230. In a refinement, the coating is a protective coating. Typically, the coating has a dense microstructure and a characteristic color. In a refinement, the coating includes a refractory metal reacted with nitrogen, oxygen and/or carbon to form a refractory metal nitride, oxide, or carbide. Examples of suitable refractory metals include, but are not limited to, chromium, hafnium, tantalum, zirconium, titanium and zirconium-titanium alloy. Chromium nitride is an example of a particularly useful coating made by the methods set forth above. In a refinement, the coating has a thickness from about 1 to about 6 microns. With reference to FIG. 10B, a variation of a chromium nitride coating, which is a multilayer structure formed by the methods set forth above, is provided. Coated article 234 includes thin layer 236 of an unreacted chromium layer disposed over substrate 228 and a thick stoichiometric chromium nitride layer 238 disposed over unreacted chromium layer 236. In a further refinement, the multilayer structure further includes layer 240 of intermediate stoichiometric chromium nitride layer disposed over the stoichiometric chromium nitride layer 238. Intermediate stoichiometric chromium nitride 240 has a stoichiometry given by $CrN_{(1-x)}$ where x is a number between 0.3 and 1.0. In a refinement, the thickness of the unreacted chromium layer 236 is between 0.05 and 0.5 microns, the thickness of the thick chromium nitride layer 238 is from 1 to 3 microns, and the intermediate stoichiometric chromium nitride 240 is from 0.5 to 1 micron.

An experimental study was conducted in a setup which resembles the scheme shown in FIG. 7A with one slave anode and one master anode. The following values of the electrical components were used in this experimental setup R=0.5 ohms, $R^1$=3 ohms. The primary arc current was established at 100 amperes, the argon pressure was 4 mtorr. In this experiment, it was found that the current of the slave anode was 5 amperes and the current of the master anode was 10 amperes. The distance between the cathode chamber and the slave anode was 60 cm, the distance between the cathode chamber and the master anode was 1.5 m. The discharge gap of 3 inches was formed by the wall of the chamber on the side of the slave anodes and the substrate holding tray. The plasma distribution is measured by appropriate electrostatic probes such as Langmuir probes, ion collector probes or by optical emission spectrography. The arc current distribution can then be controlled by adjusting the currents in the distant anode and arc cathode circuits.

Figure 11:
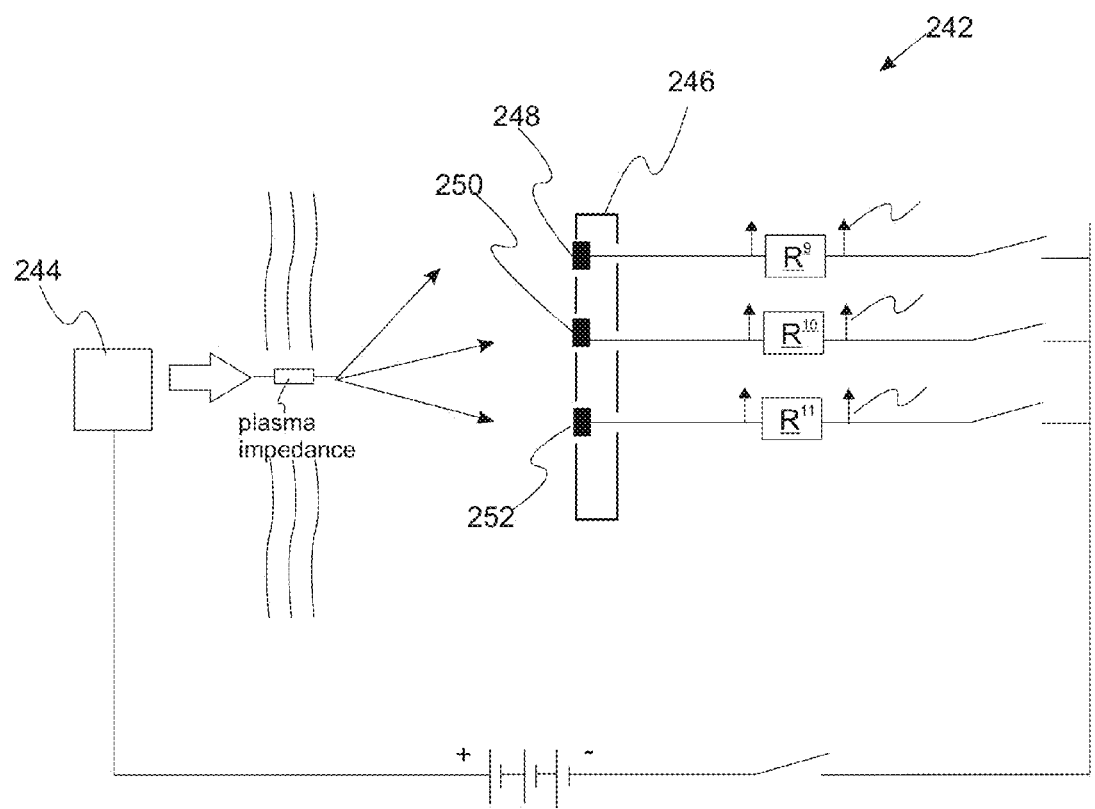
FIG. 11 provides a schematic of the placement of ion current collecting probes distributed evenly across the coating deposition area in a variation of the present invention.
Figure 12:
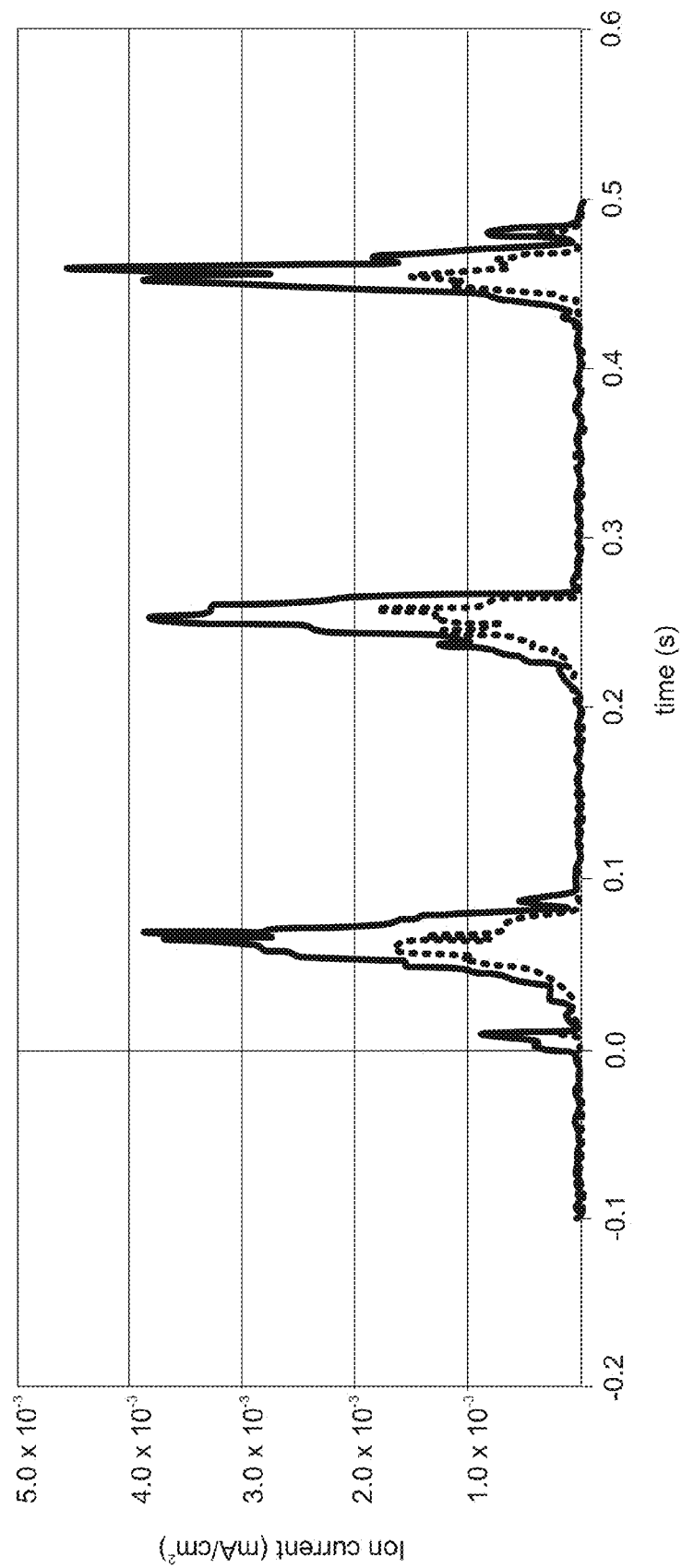
FIG. 12 provides a typical oscillogram of the ion current density collected by a disc-collector in a coating system.

The oscillation of ion current density caused by the movement of cathodic arc spots along the shielded cathode target of the remote arc discharge was demonstrated by monitoring the ion current density using a multichannel ion collecting probe. The experimental study of a spatial plasma density distribution in a large area remote arc discharge was conducted in a coating system shown schematically in FIG. 11. FIG. 11 provides a schematic of the experimental setup used in this study. Measuring system 242 includes cathode 244, floating shield 246, and an ion probe array which includes ion current collecting probes 248, 250, 252. The ion current collecting probes 248, 250, 252 were distributed evenly across the coating deposition area so the height of the collector probe array was generally equal to the height of the area of the shielded cathode and correspondingly the height of the remote anode. In these experiments, ion current collecting probes 248, 250, 252 are disc-shape ½" diameter collector probes connected to the power supply via 1 kOhm resistors $R^9$, $R^{10}$, $R^{11}$ which were used as ion current collectors. Battery 254 was used to electrically couple cathode 244 to the ion collecting probes. The voltage signal across resistors $R^9$, $R^{10}$, $R^{11}$ was measured by an oscilloscope. The density of the ion current density $j_{ik}$ collected by the disc collector k can be calculated as $j_{ik}=V_{ik}/(1000*1.23)$ mA/cm$^2$, where $V_{ik}$ is voltage drop across 1000 Ohm resistor, measured by Fluke oscilloscope, the ion current collecting area of the disc is 1.23 cm$^2$. The typical oscillogram of the ion current density collecting by one disc-collector is shown in FIG. 12. It can be seen that the ion current signal is pulsing with peak ion current density exceeding 5 mA/cm$^2$, demonstrating high plasma density generated by remote arc plasma discharge. The characteristic repetition frequency of ion current pulses is approximately 10 Hz, corresponding to the characteristic frequency of cathodic arc rastering along the 14" high cathodic arc target in a shielded cathode chamber. The cathodic arc spot rastering in this experiment was achieved by magnetic steering means. The ion current signal also possesses a high frequency component as demonstrated by an oscillogram of the voltage signal across a 1 kOhm resistor.

The fact that plasma density generated by the remote arc discharge of the present invention is oscillating in a wide range of frequencies and amplitudes was found beneficial for the quality of depositing coatings. The oscillating of the plasma density corresponds to the oscillating of the frequency and intensity of ion bombardment of the substrates during the coating deposition process. The oscillation of the ion bombardment intensities interrupts the growth of large crystalline structures (such as columns) and development of growth defects. As a result, the depositing coatings have demonstrated extremely dense structure and smooth surface profile.

Figure 13:
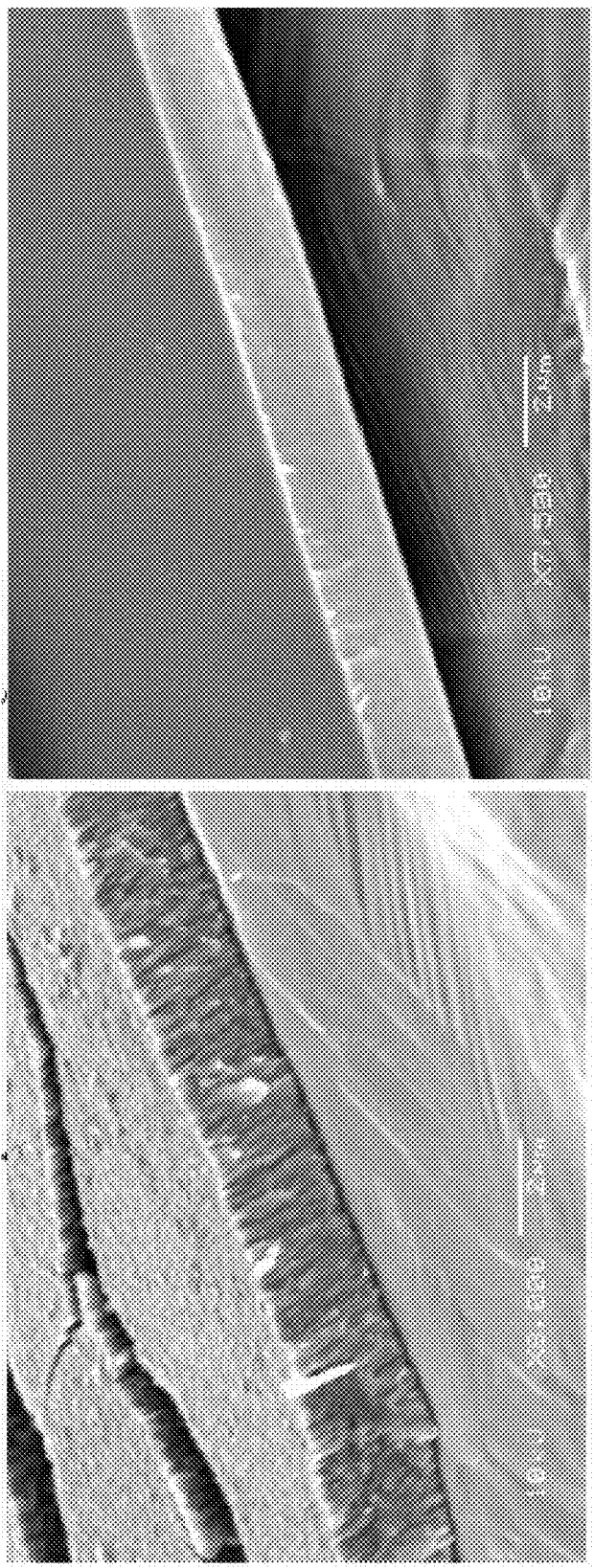
FIG. 13 provides scanning electron micrographs comparing conventional magnetron sputtering with CrN made by remote arc assisted magnetron sputtering.

Coatings produced with the methods described above produced dense coating microstructures at coating thicknesses up to 3.5 microns. The powered remote-anode current was operated at 50 amperes and the primary arc electron source at 140 amperes. The primary deposition flux is from a magnetron sputtering cathode with a solid chromium target operated at 8.5 kW. The deposition pressure was 4 mTorr with a 60/40 Ar:N$_2$ gas mixture. Optical gloss was measured at 99% for CrN films produced with these methods compared to 96.8% for films produced by magnetron sputtering. Cross-sections of the respective films are shown in FIG. 13.

Figure 14A:
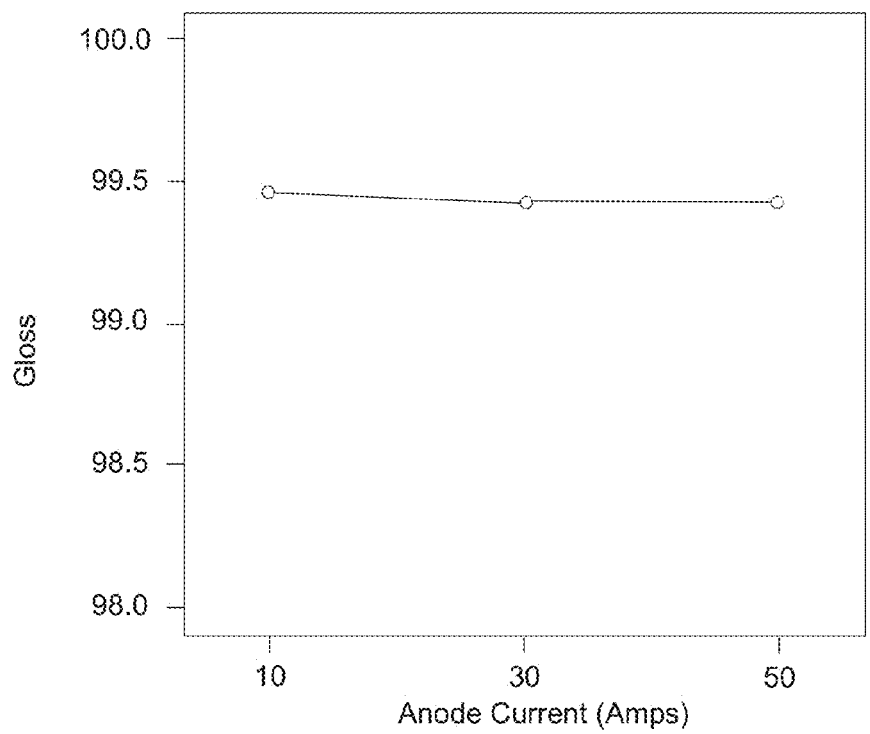
FIG. 14A provides a plot of the percent gloss versus anode current.
Figure 14B:
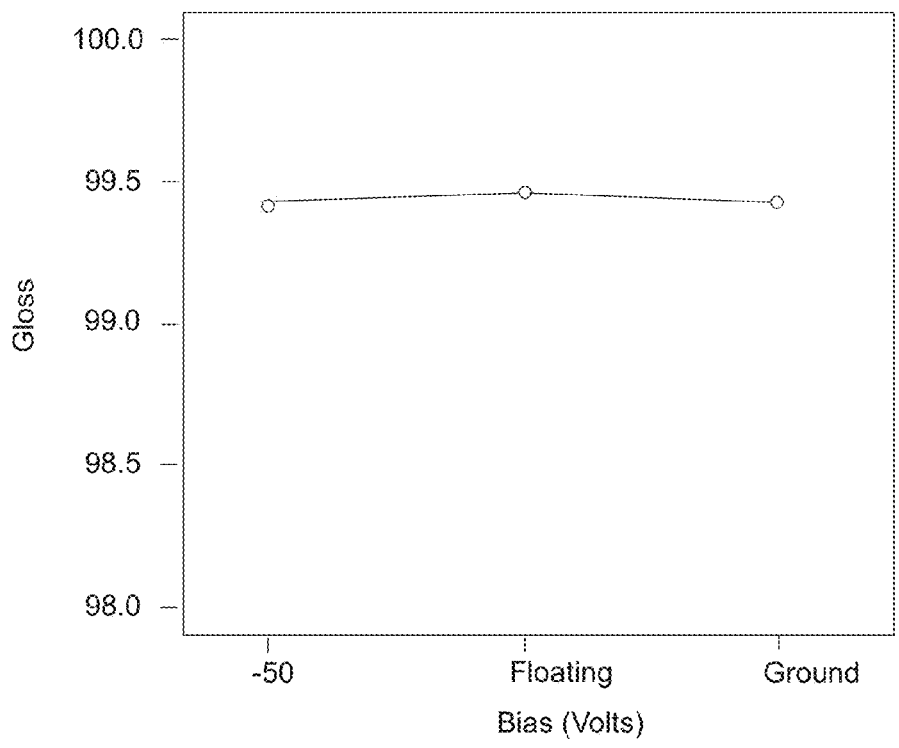
FIG. 14B provides a plot of the percent gloss versus bias.
Figure 15:
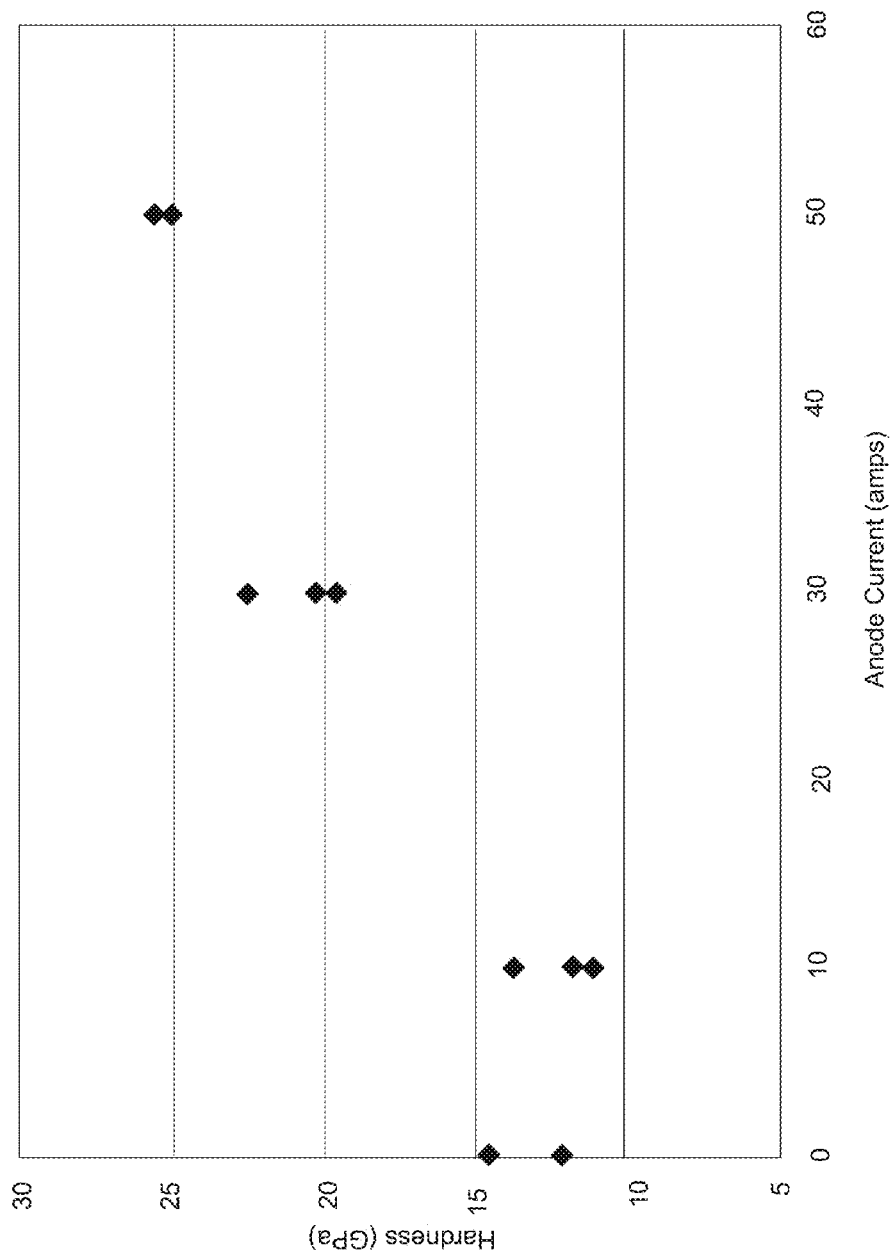
FIG. 15 provides a plot of hardness versus anode current.
Figure 16A:
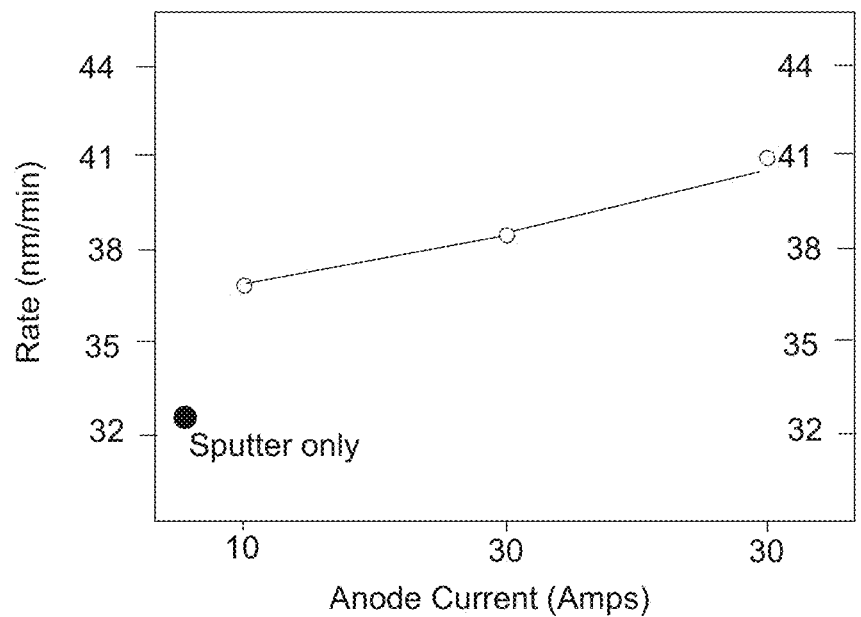
FIG. 16A provides a plot of the coating deposition rate versus anode current.
Figure 16B:
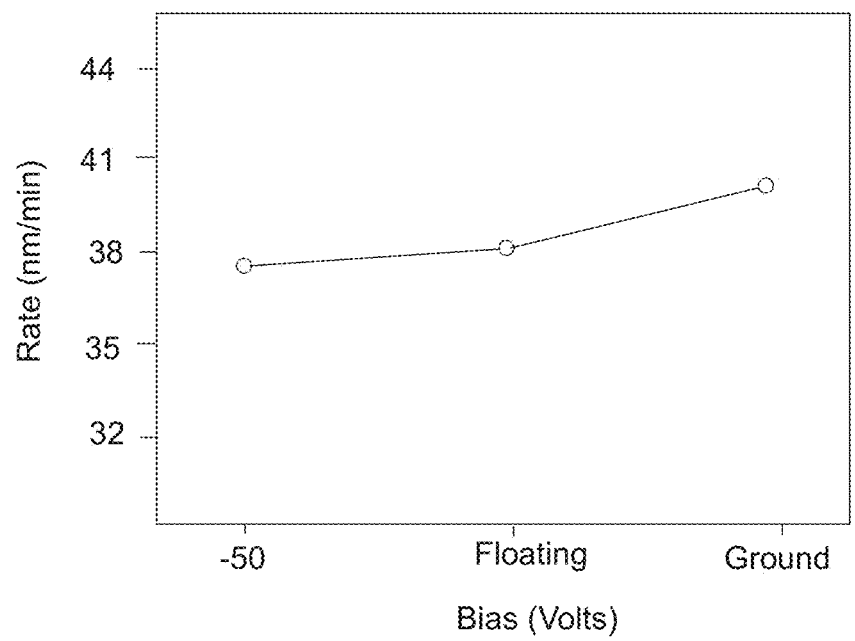
FIG. 16B provides a plot of the coating deposition rate versus bias.

The influence of remote arc discharge current and substrate bias potential on the gloss of CrN coatings deposited by the remote arc assisted magnetron sputtering (RAAMS) process set forth above was analyzed. FIG. 13 provides scanning electron micrographs comparing conventional magnetron sputtering with CrN made by remote arc assisted magnetron sputtering (RAAMS) using the following process settings during the coating deposition stage: pressure 4 mtorr, magnetron power 8.5 kW, primary arc current 140 amps, nitrogen-to-argon ratio 40% N$_2$/60% Ar. FIGS. 14A and 14B provide plots of the percent gloss versus anode current and bias, respectively. It can be seen that the resulting gloss of the coating is extremely high and does not change within the wide range of remote arc currents and substrate bias. Specifically, the coatings deposited on grounded substrates have demonstrated the same gloss as coatings deposited on substrates with floating potential or potential −50V vs. ground. This can be attributed to high positive plasma potential in remote arc plasma as shown in FIG. 5. The gaseous ions in remote arc discharge plasma have potential energy near the anode potential, which was ranging from +40 to +60V vs. ground. In this case, gaseous ions bombard the grounded substrate with energy ranging from 40 to 60 eV. This is sufficient for densifying the growing coatings process by more than 25% over conventional magnetron sputtering (MS) processes. FIG. 15 demonstrates the influence of the remote anode arc current on hardness of deposited CrN films. It should be noted that hardness of 25 GPa is about two times greater than hardness of the conventional CrN films deposited by magnetron sputtering without arc plasma assistance. FIGS. 16A and 16B provide plots of film deposition rates versus gloss versus anode current and bias, respectively. The deposition rate is higher in the case of grounded substrates vs. substrates having floating or −50V bias as shown in FIGS. 16A and 16B. This can be explained by re-sputtering of the substrates having high negative bias potential. For instance, in the case of −50V bias, the plasma potential vs. substrates reaches 100 volts resulting in substrate bombardment by gaseous ions with near 100 eV energy resulting in substantial re-sputtering of the coatings which reduces its deposition rate.

Figure 17:
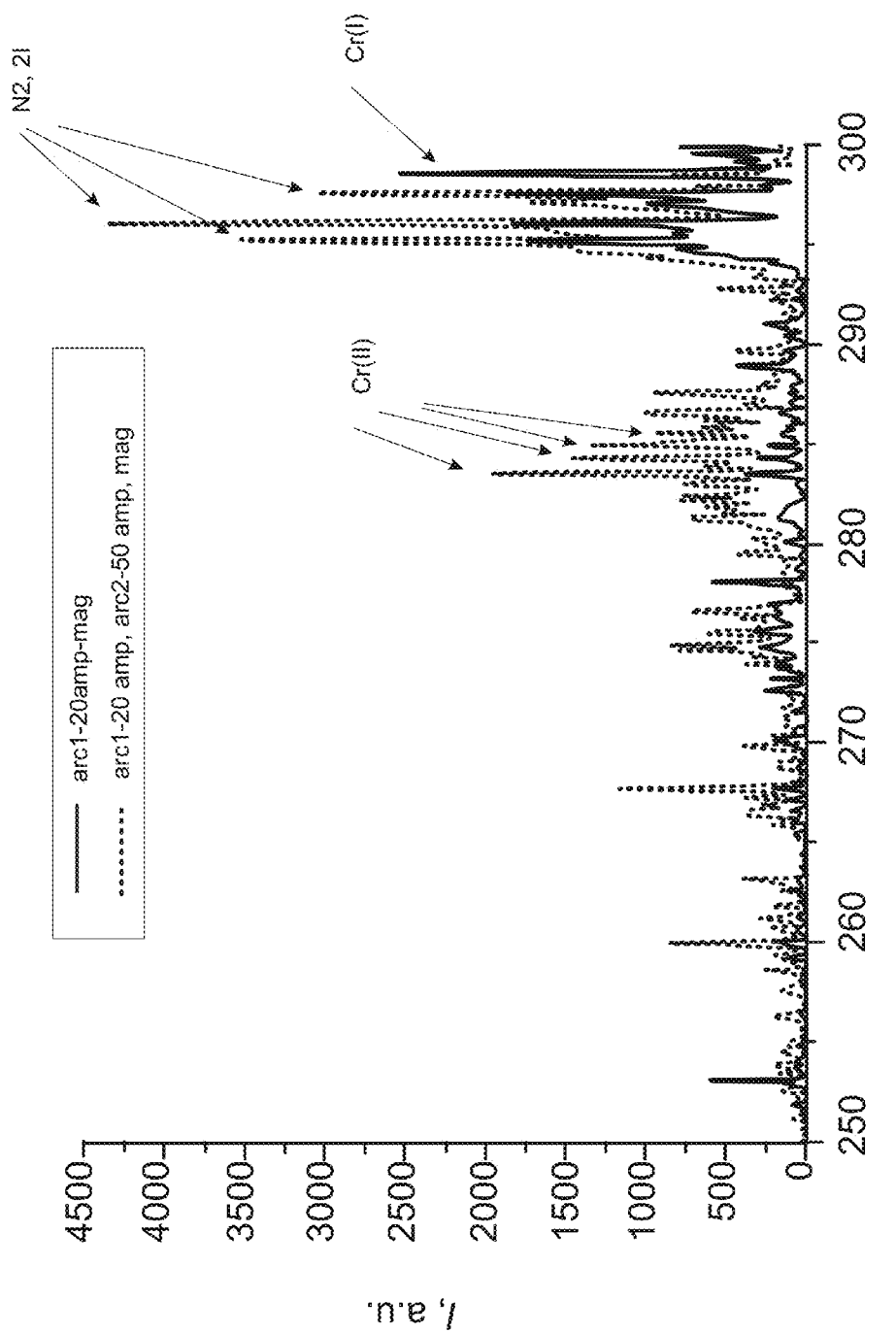
FIG. 17 provides an optical emission spectrum (OES) of the species generated by magnetron sputtering in accordance with an embodiment of the invention.
Figure 18:
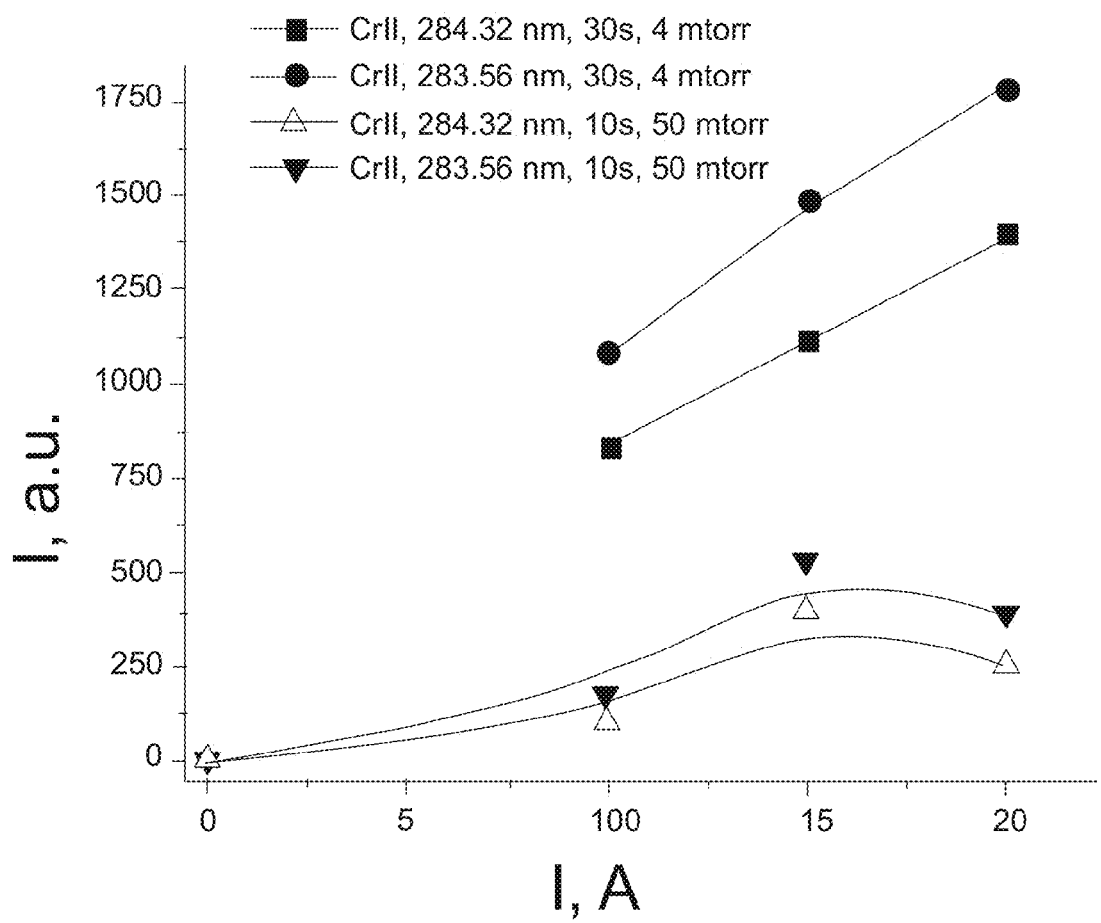
FIG. 18 provides intensities of CrII ion spectral lines versus mid anode current at 4 mtorr and 50 mtorr.

FIG. 17 provides an optical emission spectrum (OES) of the species generated by magnetron sputtering in accordance with an embodiment of the invention. The OES demonstrates the presence of metal atoms, metal ions, excited Ar atoms and ions, excited molecular nitrogen N$_2$ and molecular nitrogen ions N$_2^+$. The addition of the remote anode is observed to increase the intensity of ionized metal and excited/ionized molecular nitrogen. It has been found that increase of the remote anode current results in increase of the concentration of metal ions in a magnetron sputtering plasma as illustrated in FIG. 18 for the RAAMS chrome sputtering process. This fact provides the evidence that RAAD plasma is an effective way for ionizing of a magnetron metal sputtering flow, which otherwise has extremely low ionization, less than 0.1%. The magnetron sputtering coatings deposited from ionized sputtering flow have enhanced adhesion, smoothness, ultra-fine microstructure, high density, low concentration of coating defects and porosity and improved functional properties.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A magnetron coating system comprising:
    a vacuum chamber; and
    a coating assembly including:
        a magnetron sputtering source;
        a substrate holder to hold substrates to be coated such that the substrates are positioned in front of the magnetron sputtering source;
        a cathode chamber assembly including a cathode target comprising a plate, bar or hollow cathode, a primary anode and a shield which isolates the cathode target from the vacuum chamber, the shield defining openings for transmitting an electron emission current from the cathode target into the vacuum chamber;
        a remote anode electrically coupled to the cathode target by a secondary power supply;
        a primary power supply connected between the cathode target and the primary anode; and
    magnetron sputtering source being positioned between the cathode chamber assembly and the remote anode, the remote anode having a linear remote anode dimension, the magnetron sputtering source having a linear vapor source dimension, the cathode target having a linear cathode target dimension, and the substrate holder having a linear holder dimension such that the linear remote anode dimension, the linear vapor source dimension, the linear cathode target dimension, and the linear holder dimension are parallel to each other, with the linear remote anode dimension being equal to or greater than the linear cathode target dimension and the linear vapor source dimension such that a confined plasma streams from the cathode target through a coating region to the remote anode while substrates are positioned in front of the magnetron sputtering source during coating wherein the vacuum chamber has a circular cross section with both the cathode target and the remote anode distributed about and separated from a central axis of the vacuum chamber with the substrate holder moving in a circular direction.

2. The system of claim 1 wherein the primary anode is a ground or the shield.

3. The system of claim 1 further comprising at least one additional vapor source positioned between the cathode chamber assembly and the remote anode.

4. The system of claim 3 wherein a plurality of cathode targets are coupled to the remote anode, each cathode target of the plurality of cathode targets having a linear cathode target dimension that is parallel to the linear remote anode dimension.

5. The system of claim 1 wherein a separation from a top of the cathode chamber assembly to substrates is from about 2 to 20 inches.

6. The system of claim 1 wherein an external magnetic field is applied along a region between the magnetron sputtering source and the substrates to be coated.

7. The system of claim 6 wherein the external magnetic field is applied to magnetically insulate the cathode target of the cathode chamber assembly.

8. The system of claim 1 wherein the cathode target comprises a component selected from the group consisting of a cold vacuum arc cathode and an electron beam evaporator.

9. The system of claim 8 wherein the cathode target is made titanium or zirconium alloys.

10. The system of claim 1 wherein the shield of the cathode chamber assembly is water cooled and negatively biased in relation to the cathode target wherein a bias potential of the shield ranges from −50 volts to −1000 volts.

11. The system of claim 1 wherein plasma probes are installed between the cathode chamber assembly and the remote anode to measure plasma density, the plasma probes providing feedback for controlling the secondary power supply in which a remote anode current is adjusted to obtain a uniform distribution of the plasma density between the cathode chamber assembly and the remote anode.

12. The system of claim 1 wherein the cathode target is part of a cathode array having a plurality of cathode targets installed in the cathode chamber assembly, a linear dimension of each cathode target being substantially equal to the linear dimension of the remote anode.

13. The system of claim 1 wherein a plurality of slave remote anodes are connected to the remote anode via variable resistors.

14. The system of claim 13 wherein a plurality of slave remote anodes are connected to the remote anode with capacitors.

15. The system of claim 1 comprising a plurality of coating assemblies, each coating assembly of the plurality of coating assemblies including:
    a vapor source;
    a substrate holder to hold substrates to be coated such that the substrates are positioned in front of the vapor source;
    a cathode chamber assembly including a cathode target, an optional primary anode and a shield which isolates the cathode target from the vacuum chamber, the shield defining openings for transmitting an electron emission current from the cathode target into the vacuum chamber;
    a remote anode electrically coupled to the cathode target;
    a primary power supply connected between the cathode target and the primary anode; and
    a secondary power supply connected between the cathode target and the remote anode, the vapor source being positioned between the cathode chamber assembly and the remote anode, the remote anode having a linear remote anode dimension, the vapor source having a linear vapor source dimension, the cathode target having a linear cathode target dimension, and the substrate holder having a linear holder dimension such that the linear remote anode dimension, the linear vapor source dimension, the linear cathode target dimension, and the linear holder dimension are parallel to each other, with the linear remote anode dimension being equal to or greater than the linear cathode target dimension and the linear vapor source dimension such that a confined plasma streams from the cathode target through a coating region to the remote anode while substrates are positioned in front of the vapor sources during coating.

* * * * *